US012615826B2

(12) United States Patent
Cai et al.

(10) Patent No.: US 12,615,826 B2
(45) Date of Patent: Apr. 28, 2026

(54) SEMICONDUCTOR STRUCTURE AND METHOD FOR FORMING SAME

(71) Applicant: Semiconductor Manufacturing North China (Beijing) Corporation, Beijing (CN)

(72) Inventors: Qiaoming Cai, Beijing (CN); Lisha Ma, Beijing (CN)

(73) Assignee: Semiconductor Manufacturing North China (Beijing) Corporation, Beijing (CN)

( * ) Notice: Subject to any disclaimer, the term of this patent is extended or adjusted under 35 U.S.C. 154(b) by 511 days.

(21) Appl. No.: 18/209,241

(22) Filed: Jun. 13, 2023

(65) Prior Publication Data

US 2023/0326998 A1     Oct. 12, 2023

Related U.S. Application Data

(63) Continuation of application No. PCT/CN2020/137209, filed on Dec. 17, 2020.

(51) Int. Cl.
| | |
|---|---|
| *H10D 64/01* | (2025.01) |
| *H10D 84/01* | (2025.01) |
| *H10D 84/03* | (2025.01) |
| *H10D 84/83* | (2025.01) |

(52) U.S. Cl.
CPC ......... *H10D 64/017* (2025.01); *H10D 84/017* (2025.01); *H10D 84/0177* (2025.01); *H10D 84/038* (2025.01); *H10D 84/83* (2025.01)

(58) Field of Classification Search
None
See application file for complete search history.

(56) References Cited

U.S. PATENT DOCUMENTS

| | | | |
|---|---|---|---|
| 6,146,994 A | 11/2000 | Hwang | |
| 2018/0374964 A1* | 12/2018 | Wang | ...................... H10D 1/66 |

FOREIGN PATENT DOCUMENTS

| | | |
|---|---|---|
| CN | 101577244 | 11/2009 |
| CN | 101651137 | 2/2010 |
| CN | 102646588 | 8/2012 |
| CN | 104538299 | 4/2015 |

OTHER PUBLICATIONS

International Search Report issued Sep. 16, 2021 in International (PCT) Application No. PCT/CN20208/137209.

* cited by examiner

*Primary Examiner* — Steven B Gauthier
*Assistant Examiner* — Lamont B Koo
(74) *Attorney, Agent, or Firm* — Crowell & Moring LLP

(57)     ABSTRACT

A semiconductor structure and a method for forming the same are provided. The forming method includes: forming discrete poly gate layers on a base of a first region and a second region, the poly gate layer of the first region including a bottom gate layer and a top gate layer protruding out of the bottom gate layer, the top gate layer and the bottom gate layer defining a groove, and a polish block layer being formed on the sidewall of the groove; forming an interlayer dielectric layer on the base on the side of the poly gate layer; removing the poly gate layer of the second region to form a gate opening; and forming a metal gate layer in the gate opening.

28 Claims, 8 Drawing Sheets

SEMICONDUCTOR STRUCTURE AND METHOD FOR FORMING SAME

CROSS REFERENCE TO RELATED APPLICATIONS

This application is a continuation application of PCT Patent Application No. PCT/CN2020/137209, filed on Dec. 17, 2020, the entire content of which is incorporated herein by reference.

TECHNICAL FIELD

The present disclosure relates to the field of semiconductor manufacturing and particularly relates to a semiconductor structure and a method for forming the same.

BACKGROUND

In the semiconductor technology, even though the size of components continues to be reduced, it is still expected to further improve the performance of transistors and to manufacture integrated circuit semiconductor devices that combine applications in low, medium and high voltage ranges.

For example, integrated circuits for driving image sensors, LCDs, and printed magnetic heads (hereinafter referred to as driver IC) include a drive output unit with a high voltage MOS transistor that operates at a supply voltage of 3.3 V or more and has a good voltage tolerance between a drain and a source, and a logic unit of a control drive output unit with a low voltage MOS transistor that can be used at a supply voltage below a few volts and has a poor voltage tolerance at the drain. These integrated circuits are often referred to as system-on-chips. Although these integrated circuits contain logic transistors that operate at very low voltages (for example, 1.8 V or 2.5 V), other transistors located on the same integrated circuit are designed for high voltage applications, and therefore are operated at high voltages. Generally, the voltage difference from the drain to the source can be as high as 30 V or even 40 V. High voltage transistor elements are capable of carrying more current than logic transistors or peripheral transistors in logic circuits.

High voltage (HV) devices and medium voltage (MV) devices operate at higher voltages than low voltage (LV) devices, and the sizes of the HV devices and the MV devices are correspondingly larger. A poly gate is still adopted by the HV devices and the MV devices, while a metal gate is adopted by the LV devices. However, currently formed devices have poor performance.

SUMMARY

The present disclosure relates to a semiconductor structure and a method for forming the same, which improves the performance of the semiconductor structure.

In an aspect of the disclosure, a semiconductor structure is provided. In one form, a semiconductor structure may include: a base including a first region for forming a first device and a second region for forming a second device, the channel length of the first device being greater than the channel length of the second device; a poly gate layer located on the base of the first region, the poly gate layer including a bottom gate layer and a top gate layer protruding out of the bottom gate layer, the top gate layer and the bottom gate layer defining a groove; a metal gate layer located on the base of the second region; a polish block layer located on the sidewall of the groove; and an interlayer dielectric layer located on the base on the side of the metal gate layer and the poly gate layer.

In another aspect of the disclosure, a method for forming a semiconductor structure is provided. In one form, method may include: providing a base including a first region for forming a first device and a second region for forming a second device, the channel length of the first device being greater than the channel length of the second device; forming discrete poly gate layers on the base of the first region and the second region, the poly gate layer of the first region including a bottom gate layer and a top gate layer protruding out of the bottom gate layer, the top gate layer and the bottom gate layer defining a groove, and a polish block layer being formed on the sidewall of the groove; forming an interlayer dielectric layer on the base on the side of the poly gate layer, the interlayer dielectric layer exposing the top surface of the poly gate layer of the second region; removing the poly gate layer of the second region, and forming a gate opening in the interlayer dielectric layer; and forming a metal gate layer in the gate opening.

Compared with the prior art, the present disclosure has at least the following advantages: in a semiconductor structure described in the present disclosure, a poly gate layer is located on a base of a first region, the poly gate layer includes a bottom gate layer and a top gate layer protruding out of the bottom gate layer, and the top gate layer and the bottom gate layer define a groove, where by arranging the groove in the poly gate layer of the first region, the line width dimension, the top surface area and the spacing from an adjacent top gate layer of the top gate layer are relatively small, which is beneficial to alleviate the problem of top surface dishing generated on the poly gate layer in the planarization process when forming an interlayer dielectric layer or a metal gate layer. In addition, the semiconductor structure further includes a polish block layer located on the sidewall of the groove, where the polish block layer can play a role of blocking polish in the planarization process, thereby improving the effect of alleviating the problem of top surface dishing of the poly gate layer of the first region. In summary, the present disclosure facilitates improving the performance of the poly gate layer of the first region, thereby improving the performance of the semiconductor structure.

According to a method for forming a semiconductor structure described in the present disclosure, a formed poly gate layer of a first region includes a bottom gate layer and a top gate layer protruding out of the bottom gate layer, the top gate layer and the bottom gate layer defining a groove; and forming an interlayer dielectric layer and forming a metal gate layer both include a planarization treatment step, and by making the poly gate layer of the first region have the groove, the line width dimension, the top surface area and the spacing from an adjacent top gate layer of the top gate layer are relatively small, thereby facilitating alleviating the problem of top surface dishing of the poly gate layer of the first region in the planarization treatment process of forming the interlayer dielectric layer and forming the metal gate layer. In addition, a polish block layer is further formed on the sidewall of the groove, and in the planarization treatment process of forming the interlayer dielectric layer and forming the metal gate layer, the polish block layer can play a role of blocking polish, thereby improving the effect of alleviating the problem of top surface dishing of the poly gate layer of the first region. In summary, the present disclosure facilitates improving the performance of the poly gate layer of the first region, thereby improving the performance of the semiconductor structure.

DETAILED DESCRIPTION

It is known from the background art that the devices formed so far still suffer from the problem of poor performance. The reason for poor device performance is now analyzed in connection with a method for forming a semiconductor structure.

Figure 1:
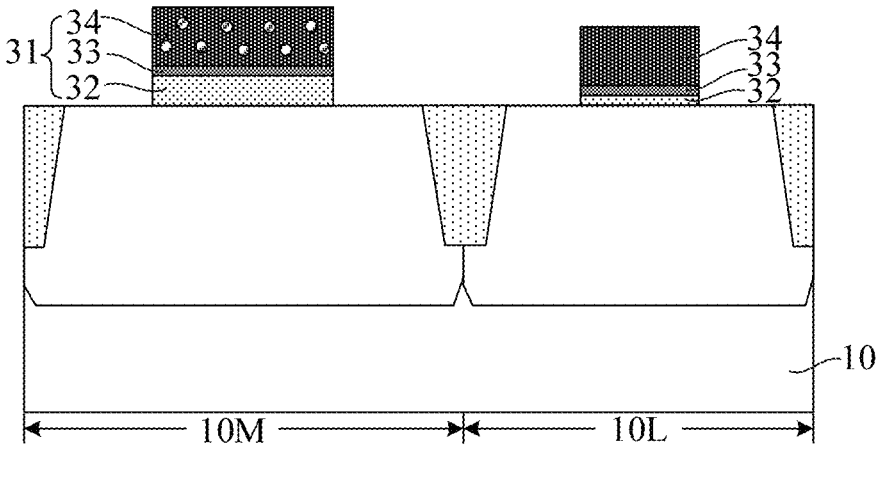
FIG. 1 to FIG. 3 are schematic structural diagrams corresponding to various steps of a method for forming a semiconductor structure.
Figure 2:
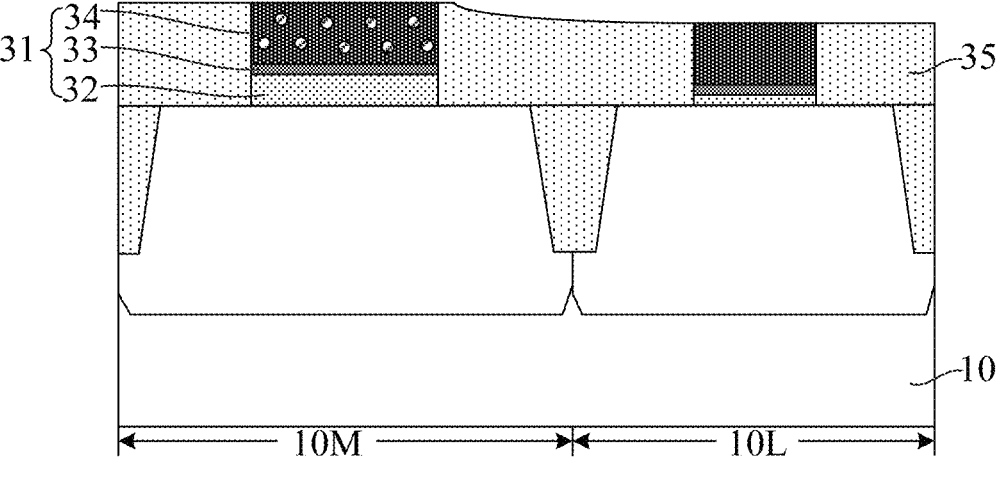
Figure 3:
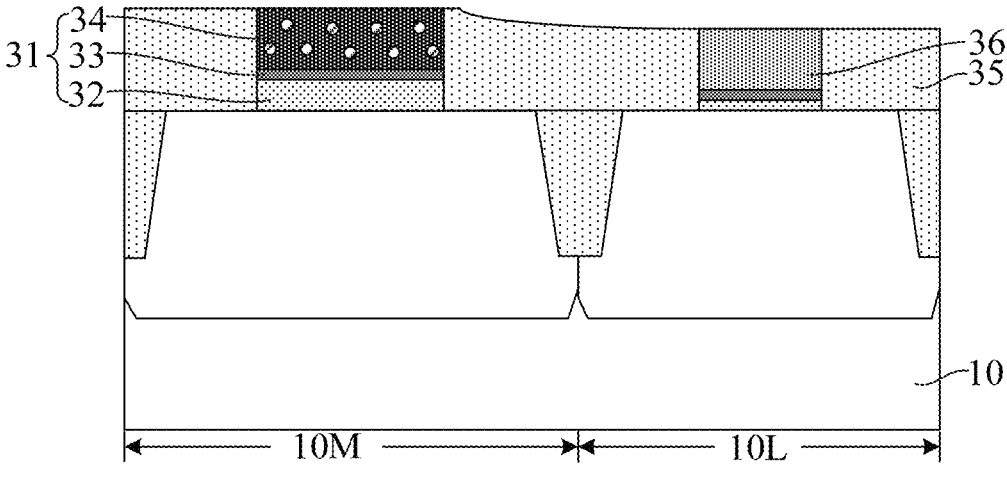

With reference to FIG. 1 to FIG. 3, schematic structural diagrams corresponding to various steps of a method for forming a semiconductor structure are shown.

With reference to FIG. 1, a base 10 is provided, and includes a first region 10M for forming a first device and a second region 10L for forming a second device, and the channel length of the first device is greater than the channel length of the second device.

With continued reference to FIG. 1, a discrete poly gate structure 31 is formed on the base 10 of the first region 10M and the second region 10L, and includes a gate dielectric layer 32, a metal block layer 33 and a poly gate layer 34 stacked in sequence from bottom to top, and the thickness of the gate dielectric layer 32 of the first region 10M is greater than the thickness of the gate dielectric layer 32 of the second region 10L.

With reference to FIG. 2, an interlayer dielectric layer 35 is formed on the base 10 on the side of the poly gate structure 31, and the interlayer dielectric layer 35 exposes the top surface of the poly gate layer 34 of the second region 10L.

The step of forming the interlayer dielectric layer 35 includes: forming a dielectric material layer (not shown in the figure) covering the sidewall and the top of the poly gate structure 31 on the base 10; and performing a planarization treatment on the dielectric material layer, removing the dielectric material layer higher than the top surface of the poly gate layer 34 of the second region 10L, and using the remaining dielectric material layer as the interlayer dielectric layer 35.

With reference to FIG. 3, the poly gate layer 34 of the second region 10L is removed, a gate opening (not shown in the figure) in the interlayer dielectric layer 35 of the second region 10L is formed, and the metal block layer 33 is exposed; and a metal gate layer 36 is in the gate opening is formed.

The step of forming the metal gate layer 36 generally includes: filling a metal gate material (not shown in the figure) in the gate opening, the metal gate material being also located on the interlayer dielectric layer 35; and performing a planarization treatment on the metal gate material, removing the metal gate material located on the top surface of the interlayer dielectric layer 35, and using the remaining metal gate material located in the gate opening as the metal gate layer 36.

Since the channel length of the first device is greater than the channel length of the second device, and the line width of the poly gate layer 34 of the first region 10M is greater than the line width of the poly gate layer 34 of the second region 10L, it is easy to cause the problem of over polish to the poly gate layer 34 of the first region 10M in the planarization treatment process of the dielectric material layer and the planarization treatment process of the metal gate material. As a result, the problem of top surface dishing of the poly gate layer 34 of the first region 10M is serious, resulting in a reduction of the thickness of the poly gate layer 34 of the first region 10M and even exposing the metal block layer 33.

In particular, the channel length of the first device is greater than the channel length of the second device, so that the operating voltage of the first device is greater than the operating voltage of the second device, and the thickness of the gate dielectric layer 32 of the first region 10M is correspondingly greater than the thickness of the gate dielectric layer 32 of the second region 10L, so that the top surface of the poly gate layer 34 of the first region 10M is higher than the top surface of the poly gate layer 34 of the second region 10L. In the planarization treatment process of the dielectric material layer and the planarization treatment process of the metal gate material, the probability of the problem of dishing occurring on the top surface of the poly gate layer 34 in the first region 10M is higher and the problem of dishing is more serious.

In order to address the technical problem, an implementation of the present disclosure provides a method for forming a semiconductor structure, by making a poly gate layer of a first region have the groove, the line width dimension, the top surface area and the spacing from an adjacent top gate layer of a top gate layer are relatively small, thereby facilitating alleviating the problem of top surface dishing of the poly gate layer of the first region in the planarization treatment process of forming an interlayer dielectric layer and forming a metal gate layer. In addition, in this implementation of the present disclosure, a polish block layer is further formed on the sidewall of the groove, and in the planarization treatment process of forming the interlayer dielectric layer and forming the metal gate layer, the polish block layer can play a role of blocking polish, thereby improving the effect of alleviating the problem of top surface dishing of the poly gate layer of the first region. In summary, this implementation of the present disclosure facilitates improving the performance of the poly gate layer of the first region, thereby improving the performance of the semiconductor structure.

To make the foregoing objects, features and advantages of this implementation of the present disclosure more comprehensible, detailed description is made to specific implementations of the present disclosure below with reference to the accompanying drawings. FIG. 4 to FIG. 19 are schematic structural diagrams corresponding to various steps of a method for forming a semiconductor structure according to an implementation of the present disclosure.

Figure 4:
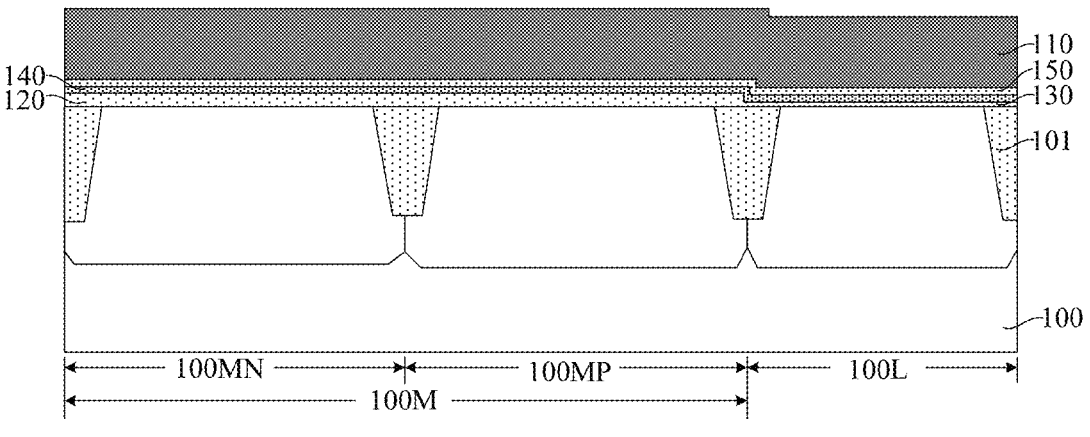
FIG. 4 to FIG. 19 are schematic structural diagrams corresponding to various steps of a method for forming a semiconductor structure according to an implementation of the present disclosure.

With reference to FIG. 4, a base 100 is provided, and includes a first region 100M for forming a first device and a second region 100L for forming a second device, and the channel length of the first device is greater than the channel length of the second device.

The base 100 is configured to provide a process platform for subsequent processing.

In this implementation, the base 100 is, for example, a planar substrate in which the base 100 is configured to form a planar field effect transistor. In other implementations, the base is configured to form a fin field effect transistor (FinFET). Accordingly, the base includes a substrate and a fin protruding out of the substrate.

In this implementation, the base 100 is a silicon substrate. In some other implementations, the base may alternatively be a substrate of other material types.

The channel length of the first device is greater than the channel length of the second device such that the operating voltage of the first device is higher than the operating voltage of the second device.

In this implementation, the first device includes one or both of a medium voltage device and a high voltage device, and the second device is a low voltage device. The operating voltages of the low voltage device, the medium voltage device and the high voltage device successively increase. In an example, the operating voltage of the low voltage device is less than 1.5 V, the operating voltage of the medium voltage device is between 1 V and 10 V, and the operating voltage of the high voltage device is greater than 10 V.

The first device may be an NMOS device or a PMOS device. Similarly, the second device may alternatively be an NMOS device or a PMOS device. In an example, the first region 100M includes a first sub-region 100MN and a second sub-region 100MP, and the first sub-region 100MN and the second sub-region 100MP are configured to form first devices of different channel conductivity types. For example, the first device formed in the first sub-region 100MN is an NMOS device and the first device formed in the second sub-region 100MP is a PMOS device.

In this implementation, an isolation structure 101 is further formed in the base 100. Specifically, the isolation structure 101 is formed in the base 100 at the junction of the first region 100M and the second region 100L. In the first region 100M, the isolation structure 101 is further formed in the base 100 at the junction of the first sub-region 100MN and the second sub-region 100MP.

The isolation structure 101 is configured to isolate between adjacent devices. In this implementation, the isolation structure 101 is a shallow trench isolation (STI) structure, so that the isolation structure 101 has a good isolation effect. In this implementation, the material of the isolation structure 101 is an insulating material, and the insulating material includes silicon oxide.

Figure 6:
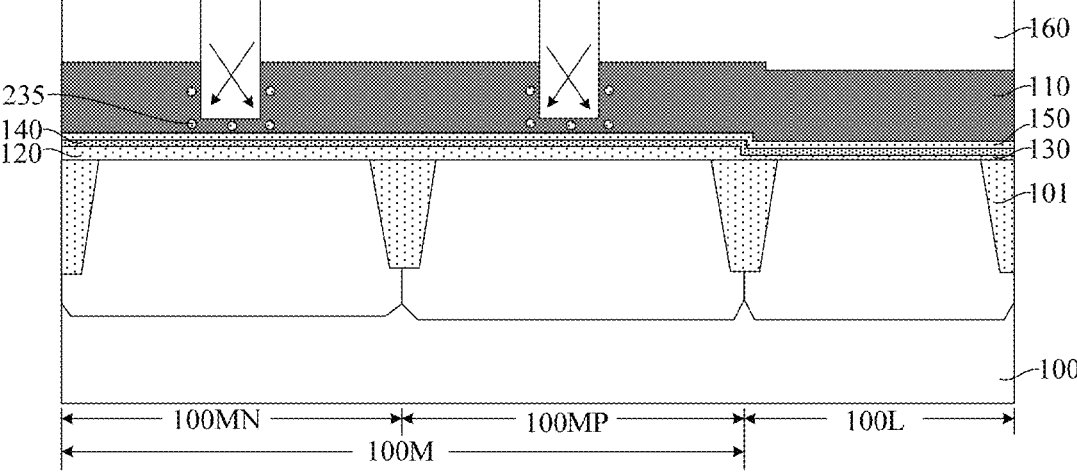
Figure 7:
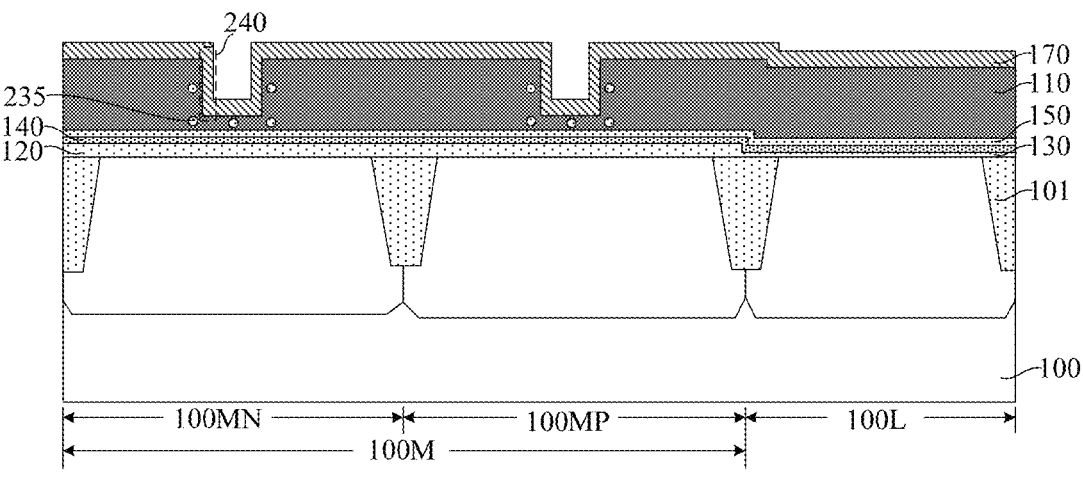
Figure 8:
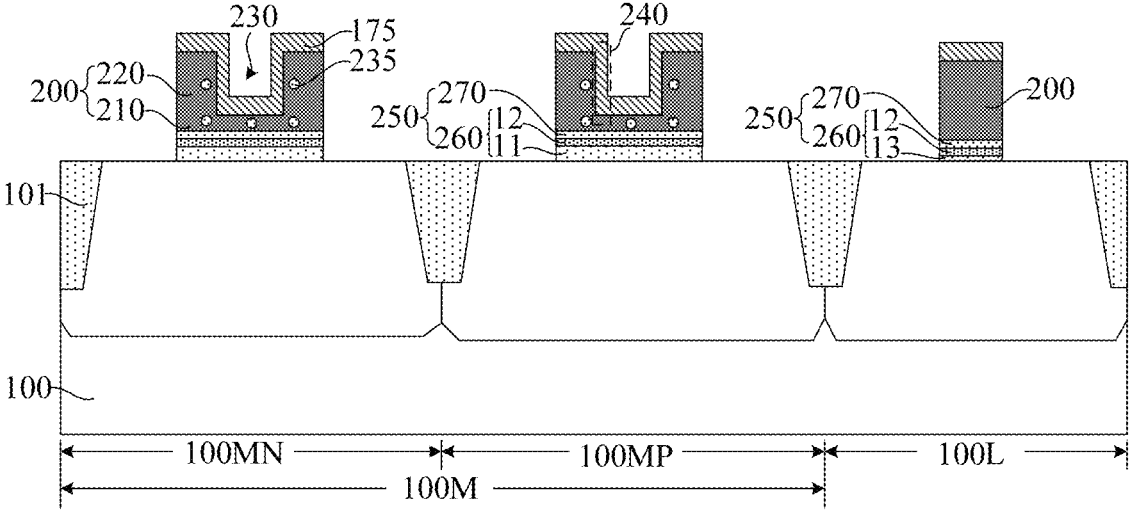

With reference to FIG. 4 to FIG. 9, discrete poly gate layers 200 (as shown in FIG. 8) are formed on the base 100 of the first region 100M and the second region 100L, the poly gate layer 200 of the first region 100M includes a bottom gate layer 210 and a top gate layer 220 protruding out of the bottom gate layer 210, the top gate layer 220 and the bottom gate layer 210 define a groove 230, and a polish block layer 240 is formed on the sidewall of the groove 230.

The poly gate layer 200 of the first region 100M serves as a device gate structure for the first device, thereby controlling the channel of the first device to be opened or closed. The poly gate layer 200 of the second region 100L is configured to occupy a spatial location for the subsequently forming a metal gate layer.

After subsequently forming an interlayer dielectric layer on the base 100 on the side of the poly gate layer 200, the poly gate layer 200 of the second region 100L is removed to form a gate opening, and then a metal gate layer is formed in the gate opening, the process of forming the metal gate layer generally includes the step of performing a planarization treatment on a metal gate material, and the larger the size of the metal gate layer, the higher the probability of the problem of dishing occurring on the top surface of the metal gate layer in the planarization process of the metal gate material. Since the first region 100M is configured to form the first device, the channel length of the first device is greater than the channel length of the second device, and the gate size of the first device is correspondingly larger. By making the first device use the poly gate layer 200, the use of the metal gate layer in the first device is avoided, thereby avoiding the problem of top surface dishing of the metal gate layer caused by the relatively large gate size in the first region 100M.

By forming a groove 230 in the poly gate layer 200 of the first region 100M, the line width dimension, the top surface area and the spacing from an adjacent top gate layer 220 of the top gate layer 220 are relatively small. Therefore, in the planarization treatment process of forming the metal gate layer, the probability of over polish caused in the poly gate layer 200 of the first region 100M is relatively low, which is beneficial to alleviate the problem of top surface dishing of the poly gate layer 200 of the first region 100M. The flatness of the top surface of the poly gate layer 200 of the first region 100M is relatively high, and the structural integrity of the poly gate layer 200 of the first region 100M is correspondingly improved, thereby facilitating improving the performance of the semiconductor structure.

In this implementation, the first region 100M includes a first sub-region 100MN and a second sub-region 100MP, and in the first region 100M, the poly gate layer 200 is discrete from the first sub-region 100MN and the second sub-region 100MP.

In this implementation, the material of the poly gate layer 200 is polysilicon.

The ratio of the thickness of the bottom gate layer 210 to the total thickness of the poly gate layer 200 is preferably neither too small nor too large. If the ratio is too small, it is easy to cause the thickness of the bottom gate layer 210 to be too small. In consideration of the effects of etch uniformity and a load effect, in the process of forming the groove 230, the probability that the bottom gate layer 210 exposed by the top gate layer 220 is etched through is relatively high, namely, it is easy for the groove 230 to penetrate the whole poly gate layer 200, thereby easily affecting the performance of the poly gate layer 200 of the first region 100M. When conductive ions are implanted in a subsequent step, the conductive ions may be implanted to a film layer structure below the bottom gate layer 210 (for example, a gate oxide layer) by passing through the bottom gate layer 210, thereby easily leading to device failure. If the ratio is too large, accordingly, the thickness of the top gate layer 220 is too small, in the planarization treatment process of subsequently forming the metal gate layer, it is easy to cause the top gate layer 220 to be completely removed, thereby easily causing over polish of the bottom gate layer 210, and then easily reducing the improvement effect on the problem of top surface dishing of the poly gate layer 200 of the first region 100M. To this end, in this implementation, the bottom gate layer 210 has a thickness of ⅕ to ⅓ of the total thickness of the poly gate layer 200.

It would be appreciated that the line width of the top gate layer 220 and the line width of the groove 230 are preferably neither too small nor too large. If the line width of the top gate layer 220 and the line width of the groove 230 are too small, it is easy to increase the process difficulty of using a photolithography process when forming the groove 230, and the spacing from the adjacent top gate layers 220 is too small, namely, the line width of the groove 230 is correspondingly too small, easily having an adverse effect on the subsequent filling effect of an interlayer dielectric layer in the groove 230. If the line width of the groove 230 is too large, the risk of the problem of top surface dishing occurring on the interlayer dielectric layer located in the groove 230 is easily increased in the planarization treatment process of subsequently forming the metal gate layer, and if the line width of the top gate layer 220 is too large, the probability of the problem of top surface dishing occurring on the top gate layer 220 is relatively high when the metal gate layer is subsequently formed. To this end, in this implementation, the line width of the top gate layer 220 is 0.15 micron to 2 microns.

Similarly, the groove 230 has an opening line width of 0.15 micron to 2 microns.

It would be appreciated that, as shown in FIG. 8, the number of the groove 230 in the poly gate layer 200 of the first region 100M is one. However, the number of the grooves 230 in the poly gate layer 200 of the first region 100M is not limited to one, but may be other numbers. For example, with reference to FIG. 9, a top view of the poly gate layer 200 of the first region 100M is illustrated. When the size of the first device is large, the number of grooves 230 in the poly gate layer 200 of the first region 100M may alternatively be plural, and the plurality of grooves 230 may be arranged in parallel at intervals.

Figure 9:
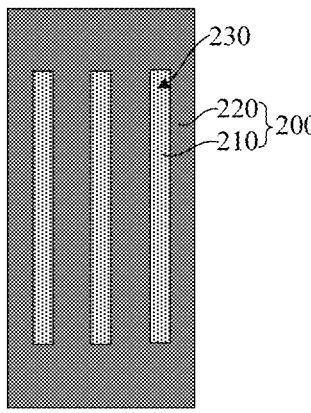

For ease of illustration and explanation, only the top gate layer 220 and the bottom gate layer 210 and the groove 230 are illustrated in FIG. 9.

In this implementation, the step of forming the poly gate layer 200 includes: forming a poly gate material layer 110 on the base 100; forming the groove 230 in the poly gate material layer 110 of the first region 100M; and patterning the poly gate material layer 110 to form the poly gate layer 200 discrete from the first region 100M and the second region 100L.

In addition, in this implementation, a polish block layer 240 is further formed on the sidewall of the groove 230, and the polish block layer 240 can play a role of blocking polish in the planarization treatment process of subsequently forming the interlayer dielectric layer and forming the metal gate layer, thereby improving the effect of alleviating the problem of top surface dishing of the poly gate layer 200 of the first region 100M.

To this end, the material of the polish block layer 240 is selected to have a relatively high hardness and density to ensure that the polish block layer 240 plays a role of blocking polish in the planarization treatment process. Specifically, the material of the polish block layer 240 is selected according to the requirement that the density and hardness of the material of the polish block layer 240 is greater than the hardness and density of the material of the poly gate layer 200, the interlayer dielectric layer and the metal gate layer. Meanwhile, since the polish block layer 240 in this implementation is formed while forming a gate mask material layer 170, a material having high process compatibility is selected for the polish block layer 240 in view of process compatibility, thereby reducing the process risk and cost.

In this implementation, the material of the polish block layer 240 includes silicon nitride or silicon oxynitride. In an example, the material of the polish block layer 240 is silicon nitride.

In this implementation, the polish block layer 240 is formed on the sidewall of the groove 230 after the groove 230 is formed in the poly gate material layer 110 in the first region 100M and before the poly gate material layer 110 is patterned.

In this implementation, the forming method further includes: in the step of forming the poly gate layer 200, further forming a laminated structure 250 located between the poly gate layer 200 and the base 100, where the laminated structure 250 includes a gate dielectric layer 260 and a metal block layer 270 located on the gate dielectric layer 260; and the thickness of the gate dielectric layer 260 of the first region 100M is greater than the thickness of the gate dielectric layer 260 of the second region 100L.

In this implementation, the thickness of the gate dielectric layer 260 of the first region 100M is greater than the thickness of the gate dielectric layer 260 of the second region 100L, so the top surface of the poly gate layer 200 of the first region 100M is higher than the top surface of the poly gate layer 200 of the second region 100L.

The gate dielectric layer 260 of the first region 100M is configured to electrically isolate the poly gate layer 200 from the channel of the first device. The gate dielectric layer 260 of the second region 100L is configured to electrically isolate the subsequent metal gate layer from the channel of the second device.

The thickness of the gate dielectric layer 260 of the first region 100M is greater than the thickness of the gate dielectric layer 260 of the second region 100L, thereby enabling the first device to withstand a greater operating voltage.

In this implementation, the gate dielectric layer 260 of the first region 100M includes a gate oxide layer 11 and a high-k gate dielectric layer 12 located on the gate oxide layer 11, and the gate dielectric layer 260 of the second region 100L includes an interfacial buffer layer 13 and a high-k gate dielectric layer 12 located on the interfacial buffer layer 13, so that the thickness of the gate dielectric layer 260 of the first region 100M is greater because the gate oxide layer 11 is thicker than the interfacial buffer layer 13. In this implementation, the material of the gate oxide layer 11 and the interfacial buffer layer 13 is silicon oxide.

In this implementation, the material of the high-k gate dielectric layer 12 is a high-k dielectric material, where the high-k dielectric material refers to a dielectric material having a relative dielectric constant greater than that of silicon oxide. Specifically, the material of the high-k gate dielectric layer 12 may be selected from HfO2, ZrO2, HfSiO, HfSiON, HfTaO, HfTiO, HfZrO, Al2O3, or the like. In an example, the material of the high-k gate dielectric layer 12 is HfO2.

The metal block layer 270 is configured to isolate the gate dielectric layer 260 from the poly gate layer 200, and isolate the gate dielectric layer 260 from a subsequently formed metal gate layer, so as to protect the gate dielectric layer 260. In addition, in the process of subsequently etching and removing the poly gate layer 200 of the second region 100L, the metal block layer 260 serves as an etch stop layer, so as to reduce the probability of damage to the gate dielectric layer 260. In addition, after the metal gate layer is subsequently formed, the metal block layer 270 is further configured to block diffusion of readily diffusible ions in the metal gate layer (for example: aluminum ions) into the gate dielectric layer 260. Specifically, the metal block layer 270 is configured to protect the high-k gate dielectric layer 12, reduce the probability of damage to the high-k gate dielectric layer 12, and prevent diffusion of readily diffusible ions in the metal gate layer into the high-k gate dielectric layer 12. The metal block layer 270 also has a certain effect on the gate work function of the second device.

The material of the metal block layer 270 includes one or both of TiN and TiSiN doped with silicon. In this implementation, the material of the metal block layer 270 is titanium nitride.

In the actual technological process, the thickness of the metal block layer 270 is rationally set so as to ensure that the metal block layer 270 can act as an etch stop layer in the subsequent etching process for removing the poly gate layer 200 of the second region 100L, and in addition, the metal block layer 270 has a better blocking effect on the readily diffusible ions in the metal gate layer.

The specific steps for forming the poly gate layer 200, the polish block layer 240 and the laminated structure 250 according to this implementation will be described in detail with reference to the accompanying drawings.

As shown in FIG. 4, a gate oxide material layer 120 located on the base 100 of the first region 100M and an interfacial buffer material layer 130 located on the base 100 of the second region 100L are formed. A high-k gate dielectric material layer 140 and a metal block material layer 150 located on the gate dielectric material layer 140 are formed on the gate oxide material layer 120 and the interfacial buffer material layer 130.

The gate oxide material layer 120 is configured to form the gate oxide layer. The high-k gate dielectric material layer 140 is configured to form the high-k gate dielectric layer. The metal block material layer 150 is configured to form the metal block layer. The interfacial buffer material layer 130 is configured to form the interfacial buffer layer. The interfacial buffer layer is configured to improve the electron mobility, and improve the interfacial stability and device reliability.

In this implementation, the material of the interfacial buffer material layer 130 is the same as the material of the gate oxide material layer 120, and the interfacial buffer material layer 130 is thinner and has a thickness less than the thickness of the gate oxide material layer 120.

As shown in FIG. 4, the poly gate material layer 110 is formed on the base 100. Specifically, the poly gate material layer 110 is formed on the metal block material layer 150. The poly gate material layer 110 is configured to form the poly gate layer.

Figure 5:
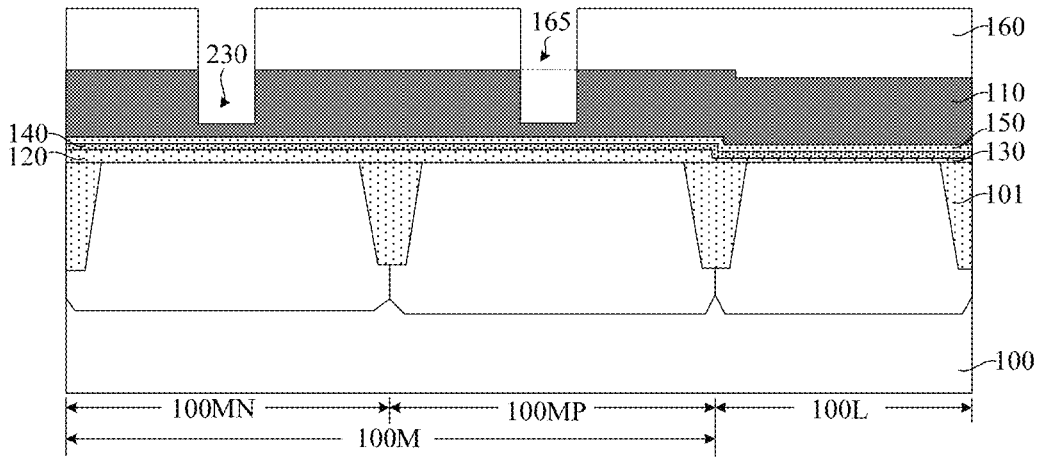

As shown in FIG. 5, the groove 230 is formed in the poly gate material layer 110 in the first region 100M.

In this implementation, the step of forming the groove 230 in the poly gate material layer 110 of the first region 100M includes: forming a mask layer 160 on the poly gate material layer 110, the mask layer 160 having a mask opening 165 located in the first region 100M; and with the mask layer 160 as a mask, etching a partial thickness of the poly gate material layer 110 along the mask opening 165.

The mask layer 160 serves as a mask for etching the poly gate material layer 110 to form the groove. The mask opening 165 is configured to define the location and shape of the groove. In this implementation, the mask opening 165 is located in the first sub-region 100MN and the second sub-region 100MP, respectively.

In this implementation, the material of the mask layer 160 includes photoresist. The mask layer 160 is formed by a photolithography process such as exposure and development.

In this implementation, a partial thickness of the poly gate material layer 110 is etched using an anisotropic dry etching process. The anisotropic etching process has the property of anisotropic etching, i.e., the longitudinal etching rate is much greater than the lateral etching rate, so that a better etched profile can be obtained to improve the morphological quality and dimensional accuracy of the groove 230. Furthermore, the amount of longitudinal etching of the poly gate material layer 110 can be accurately controlled easily.

As shown in FIG. 6, in this implementation, the forming method further includes: doping conductive ions 235 in the poly gate material layer 110 at the bottom and sidewall of the groove 230 after forming the groove 230 in the poly gate material layer 110 of the first region 100M and before patterning the poly gate material layer 110. Specifically, in this implementation, the conductive ions 235 are doped in the poly gate material layer 110 at the bottom and sidewall of the groove 230 after the groove 230 is formed and before the mask layer 160 for defining the location and shape of the groove 230 is removed.

The conductive ions 235 are doped in the poly gate material layer 110 at the bottom and sidewall of the groove 230, so that the conductive ions 235 are doped in the poly gate layer of the first region 100M, which facilitates reducing the resistance of the poly gate layer of the first region 100M, thereby reducing the gate resistance of the first device.

Furthermore, in this implementation, the conductive ions 235 are doped before the mask layer 160 is removed, so that the mask layer 160 can continue to serve as a mask for ion doping, and the mask layer 160 protects the poly gate material layer 110 of the second region 100L. In addition, in the process of doping the conductive ions 235 and forming the groove 230 in this implementation, a mask can be shared, thereby saving the mask and then reducing the manufacturing cost.

In this implementation, the step of doping the conductive ions 235 in the poly gate material layer 110 at the bottom and the sidewall of the groove 230 includes: with the mask layer 160 as a mask, performing ion implantation on the poly gate material layer 110 exposed by the groove 230, and the direction of ion implantation forming an acute angle with the normal of the surface of the base 100.

The direction of implantation of the conductive ions 235 forms an acute angle with the normal of the surface of the base 100 so that the conductive ions 235 can be implanted into the poly gate material layer 110 through the bottom and sidewall of the groove 230, the probability of the conductive ions 235 being implanted from the sidewall of the groove 230 to the top gate layer is increased, the implanted ions is activated by a subsequent thermal treatment, and the implanted ions are diffused, thereby reducing the resistance of the poly gate layer of the first region 100M, and correspondingly reducing the gate resistance of the first device.

In this implementation, the conductive ions 235 include B ions, Ga ions, In ions, P ions, As ions, or Sb ions.

In this implementation, the conductive ions 235 are implanted into the poly gate material layer 110 exposed by the groove 230 in a mode of ion implantation. The ion implantation process is relatively simple.

The implantation energy of ion implantation is preferably neither too large nor too small. If the implantation energy is too small, it is difficult to ensure that the conductive ions 235 are implanted into the poly gate material layer 110 at the bottom and the sidewall of the groove 230, and accordingly it is difficult to ensure that both the top gate layer and the bottom gate layer are doped with the conductive ions 235. Furthermore, it is easy to reduce the uniformity of the doping concentration of the conductive ions 235 in the poly gate layer, and accordingly, it is not conducive to reduce the resistance of the poly gate layer of the first region 100M. If the implantation energy is too large, the conductive ions 235 are easily implanted into the film layer structure below the poly gate material layer 110 (for example, the high-k gate dielectric material layer 140, the gate oxide material layer 120, or the base 100) via the bottom of the groove 230, thereby easily having an adverse effect on the device performance. To this end, in this implementation, the implantation energy of ion implantation is 1 KeV to 10 KeV.

It would be appreciated that in the actual process, the implantation angle of the ion implantation is flexibly adjusted according to the actual groove 230 and the opening size of the mask opening 165, so as to ensure that the conductive ions 235 can be implanted into the poly gate material layer 110 at the sidewall and bottom of the groove 230, thereby improving the doping distribution uniformity of the conductive ions 235 in the poly gate layer.

In an example, when the opening line width of the groove 230 is 150 nm, the angle between the implantation direction of the ion implantation and the normal of the surface of the base 100 is 5° to 30°.

In this implementation, after the conductive ions 235 are doped in the poly gate material layer 110 at the bottom and sidewall of the groove 230, the forming method further includes: removing the mask layer 160 to facilitate conducting the subsequent process. Specifically, the mask layer 160 is removed using one or both of an ashing process and a wet degumming process.

As shown in FIG. 7, the polish block layer 240 is formed on the sidewall of the groove 230.

Specifically, in this implementation, the step of forming the polish block layer 240 includes: after forming the groove 230 and before patterning the poly gate material layer 110, forming a gate mask material layer 170 on the poly gate material layer 110 and the bottom and sidewall of the groove 230, the gate mask material layer 170 located on the sidewall of the groove 230 serving as the polish block layer 240.

The gate mask material layer 170 is further configured to form a gate mask layer, and the gate mask layer serves as a mask for patterning the poly gate material layer 110.

Therefore, in this implementation, after forming the groove 230 and before patterning the poly gate material layer 110, the gate mask material layer 170 is formed, and the gate mask material layer 170 located on the sidewall of the groove 230 serves as the polish block layer 240. The step of forming the polish block layer 240 can be integrated with the step of forming the gate mask layer and subsequently patterning the poly gate material layer 110, and an additional process step of forming the polish block layer 240 is not needed, so that the process compatibility and the process integration degree are improved, which is beneficial for the reduction of the process risks and costs.

In addition, the material having a relatively high density and hardness is generally selected for the gate mask layer, so that the gate mask layer serves as a mask for patterning the poly gate material layer 110, while the gate mask material layer 170 located on the sidewall of the groove 230 serves as the polish block layer 240, so that the polish block layer 240 may play a role of blocking polish.

In this implementation, the gate mask material layer 170 is formed using a deposition process. The deposition process includes a chemical vapor deposition process or an atomic layer deposition process.

In an example, using an atomic layer deposition process to form the gate mask material layer 170 is beneficial to improve the step coverage ability, thickness uniformity and film formation quality of the gate mask material layer 170 (for example: density, and less impurity defects), which in turn facilitates improving the coverage ability of the polish block layer 240 on the sidewall of the groove 230, and the density and hardness of the polish block layer 240.

As shown in FIG. 8, the poly gate material layer 110 is patterned to form the poly gate layer 200 discrete from the first region 100M and the second region 100L.

In this implementation, the step of patterning the poly gate material layer 110 includes: patterning the gate mask material layer 170, reserving the gate mask material layer 170 located at the bottom and sidewall of the groove 230, and extending the gate mask material layer 170 located at the top of the poly gate material layer 110 and located at the top of the poly gate material layer 110 of the second region 100L for serving as a gate mask layer 175; and with the gate mask layer 175 as a mask, patterning the poly gate material layer 110 to form the poly gate layer 200.

In this implementation, in the step of patterning the poly gate material layer 110, the metal block material layer 150, the high-k gate dielectric material layer 140, the gate oxide material layer 120 and the interfacial buffer material layer 130 are further patterned with the gate mask layer 175 as a mask to form the metal block layer 270, the high-k gate dielectric layer 12, the gate oxide layer 11 and the interfacial buffer layer 13.

The gate dielectric layer 260 of the first region 100M is composed of the gate oxide layer 11 and the high-k gate dielectric layer 12, and the gate dielectric layer 260 of the second region 100L is composed of the high-k gate dielectric layer 12 and the interfacial buffer layer 13. The gate dielectric layer 260 and the metal block layer 270 located on the gate dielectric layer 260 form the laminated structure 250.

Figure 10:
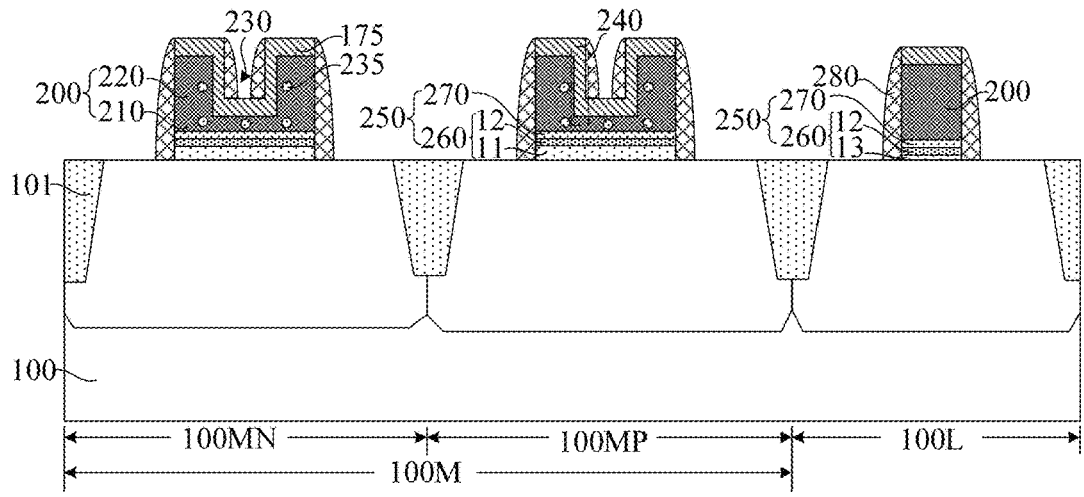

With reference to FIG. 10, after forming the poly gate layer 200 and the polish block layer 240 and before forming the interlayer dielectric layer, the method for forming the semiconductor structure further includes: forming side walls 280 on the sidewall of the poly gate layer 200 and the polish block layer 240 on the sidewall of the groove 230.

The side wall 280 is configured to protect the sidewall of the poly gate layer 200 and also configured to define the location of subsequent a source/drain doped region. Furthermore, the side wall 280 is further formed on the sidewall of the groove 230 to be beneficial to further reduce the probability of over polish of the top surface of the poly gate layer 200 in the first region 100M in the subsequent planarization treatment process, thereby further alleviating the problem of top surface dishing of the poly gate layer 200.

In this implementation, the material of the side wall 280 includes silicon nitride. The silicon nitride has a relatively high hardness and density, and the planarization process has a relatively low polishing rate on the side wall 280, thereby further alleviating the problem of top surface dishing of the poly gate layer 200 of the first region 100M.

The side wall 280 may be of a laminated structure or a single layer structure. In an example, the side wall 280 is of a laminated structure, and the side wall 280 includes a first silicon oxide layer covering the sidewalls of the poly gate layer 200 and the groove 230, a silicon nitride layer covering the sidewall of the first silicon oxide layer, and a second silicon dioxide layer located on the silicon nitride layer.

Figure 11:
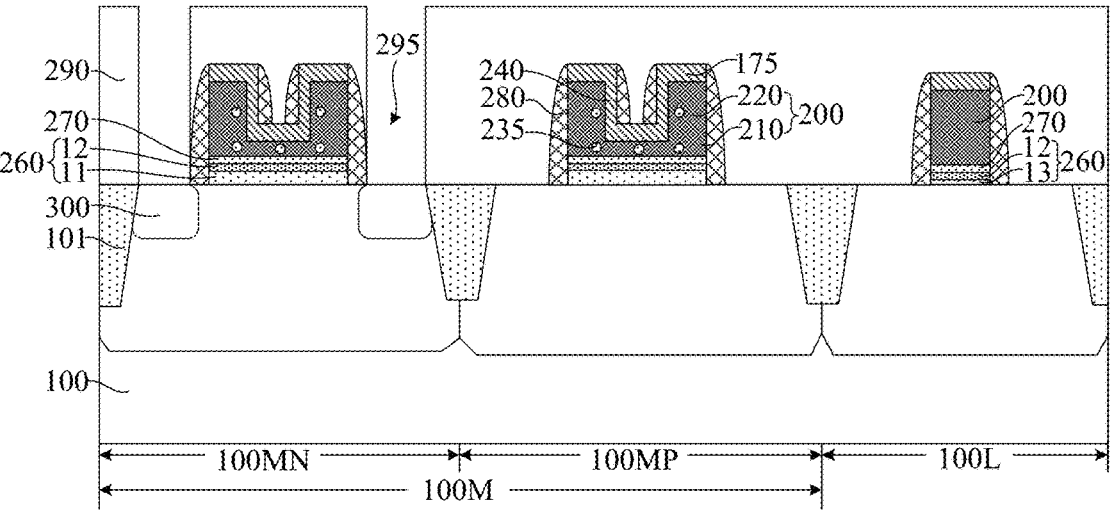
Figure 12:
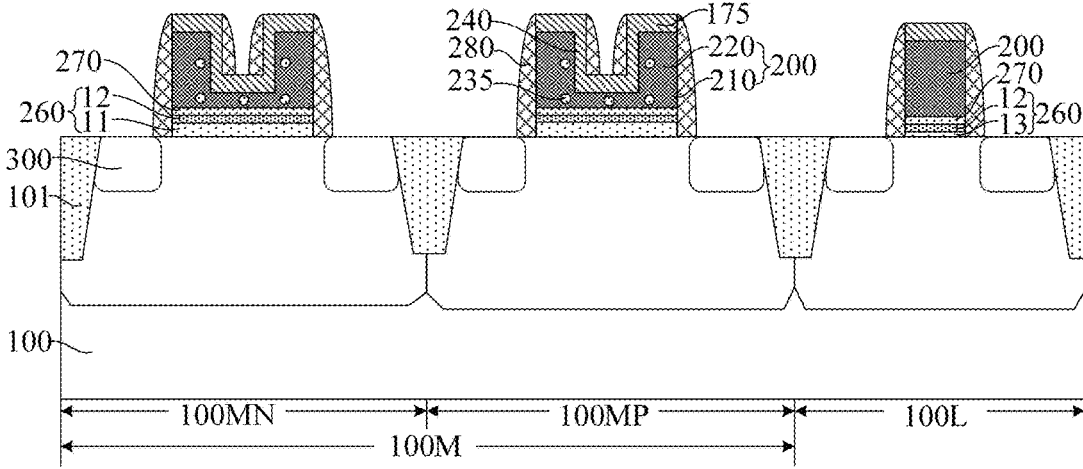

With reference to FIG. 11 and FIG. 12, the forming method further includes: after forming the poly gate layer 200 and the polish block layer 240 and before forming the interlayer dielectric layer, forming a source/drain doped region 300 in the base 100 on both sides of the poly gate layer 200. Specifically, in this implementation, the source/drain doped region 300 is formed after the side wall 280 is formed and before the interlayer dielectric layer is formed.

The source/drain doped region 300 serves as a source region or drain region of the formed device.

When the formed device is an NMOS device, doped ions in the source/drain doped region 300 are N-type ions, where the N-type ions include P ions, As ions or Sb ions. When the formed device is a PMOS device, doped ions in the source/drain doped region 300 are P-type ions, where the P-type ions include B ions, Ga ions or In ions.

In this implementation, the step of forming the source/drain doped region 300 includes: forming a shield layer 290 on the base 100, the shield layer 290 also covering the poly gate layer 200 of the first region 100M and the second region 100L, and forming doping openings 295 in the shield layer 290 on both sides of the poly gate layer 200; and with the shield layer 290 as a mask, performing ion doping on the base 100 exposed by the doping opening 295 to form the source/drain doped region 300; and removing the shield layer 290.

Specifically, the first region 100M and the second region 100L are respectively subjected to a source and drain doping treatment to form the source/drain doped region 300.

In this implementation, taking the example of forming the source/drain doped region 300 in the base 100 of the first sub-region 100MN, the source and drain doping treatment includes: forming the shield layer 290 on the base 100, the shield layer 290 also covering the poly gate layer 200 of the first region 100M and the second region 100L, and in the first sub-region 100MN, forming the doping opening 295 penetrating the shield layer 290 in the shield layer 290 on both sides of the poly gate layer 200; and doping the base 100 exposed by the doping opening 295 to form the source/drain doped region 300.

In this implementation, the base 100 exposed by the doping opening 295 is doped using an ion implantation process to form the source/drain doped region 300.

In this implementation, after forming the source/drain doped region 300, the source and drain doping treatment further includes: removing the shield layer 290.

Accordingly, with reference to FIG. 12, the second sub-region 100MP and the second region 100L are respectively subjected to the source and drain doping treatment so as to form the source/drain doped region 300 in the base 100 on both sides of the poly gate layer 200 of the first sub-region 100MN and in the base 100 on both sides of the poly gate layer 200 of the second region 100L, respectively. Specific steps may refer to the description of forming the source/drain doped region 300 in the base 100 of the first sub-region 100MN and will not be described in detail herein.

It would be appreciated that when forming the source/drain doped region 300, due to the large implantation energy of the ion implantation process, the probability of ions being implanted into the gate dielectric layer 260 and the base 100 below the poly gate layer 200 via the bottom of the groove 230 is reduced by making the shield layer 290 also cover the bottom of the groove 230.

Figure 13:
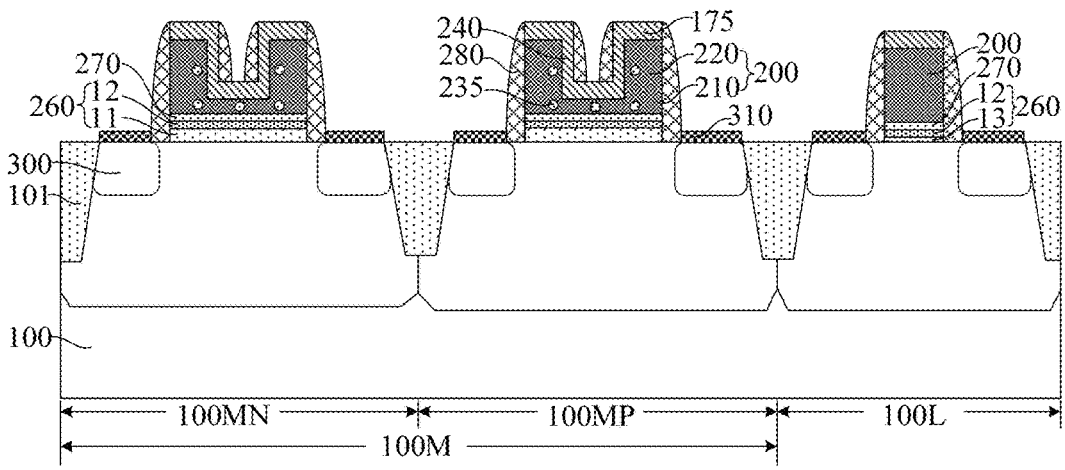

With reference to FIG. 13, a source and drain salicide layer 310 is formed on the top surface of the source/drain doped region 300.

A source/drain contact plug is subsequently formed on the top of the source/drain doped region 300, thereby reducing the contact resistance between the source/drain doped region 300 and the source/drain contact plug by forming the source and drain salicide layer 310. In this implementation, the material of the source and drain salicide layer 310 may be a nickel-silicon compound, a cobalt-silicon compound, or a titanium-silicon compound.

It would be appreciated that, in this implementation, the gate mask layer 175 is formed on the top of the top gate layer 220 and the bottom of the groove 230, and the polish block layer 240 is formed on the sidewall of the groove 230. The surface of the poly gate layer 200 is covered in the process of forming the source and drain salicide layers 310, thereby avoiding the formation of the gate salicide layer on the top surface of the poly gate layer 200. The gate salicide layer is not polished in the planarization treatment process of subsequently forming the metal gate layer, thereby avoiding metal contamination of a polishing machine table.

It would be appreciated that a step of forming a salicide block (SAB) layer is also included after forming the source/drain doped region 300 and before forming the source and drain salicide layer 310. By forming the salicide block layer, regions for forming the source and drain salicide layer 310 are exposed and regions where it is not expected to form the salicide layer are protected.

Figure 14:
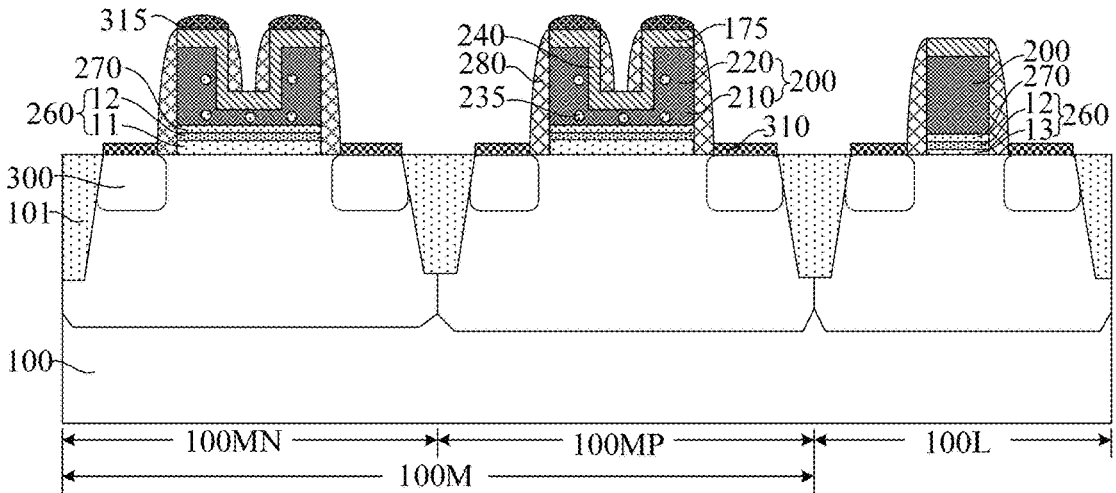

In the actual process, a salicide block layer 315 may also be formed on top of the top gate layer 220 (as shown in FIG. 14). Specifically, the salicide block layer 315 may be located on the top of the gate mask layer 175 on the top gate layer 220.

Therefore, the gate mask layer 175 and the salicide block layer 315 are formed on the top of the top gate layer 220, and the film layer on the top gate layer 220 is thicker, which is advantageous for improving the polish blocking effect in the subsequent planarization process, correspondingly improving the effect of alleviating the problem of top surface dishing of the poly gate layer 200. The material of the salicide block layer 315 includes silicon nitride. The silicon nitride material has a relatively large density and hardness, thereby improving the block effect in the subsequent planarization process.

Figure 15:
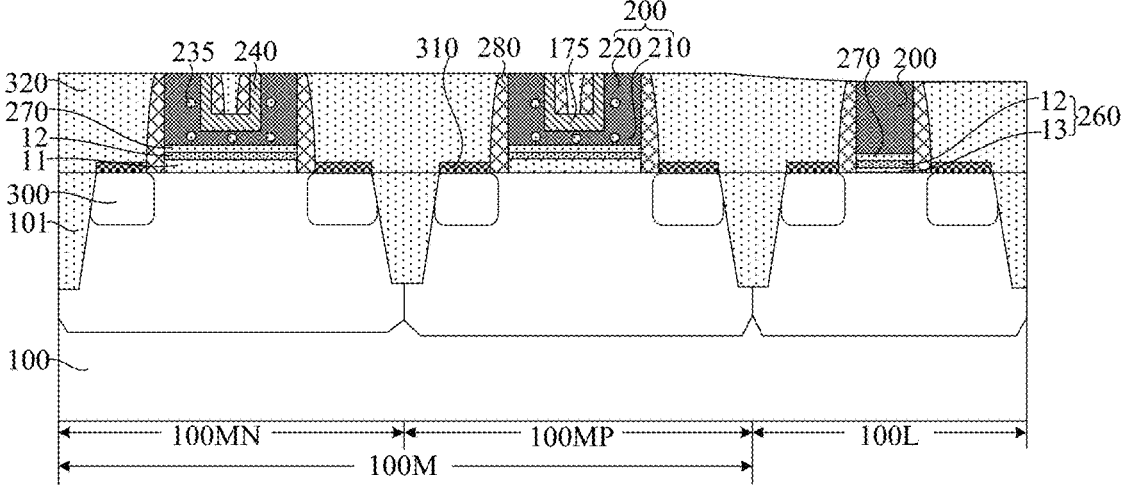

With reference to FIG. 15, the interlayer dielectric layer 320 is formed on the base 100 on the side of the poly gate layer 200, and the interlayer dielectric layer 320 exposes the top surface of the poly gate layer 200 of the second region 100L.

The interlayer dielectric layer 320 is configured to isolate adjacent devices. Furthermore, the interlayer dielectric layer 320 exposes the top of the poly gate layer 200 of the second region 100L to facilitate removing the poly gate layer 200 of the second region 100L.

The material of the interlayer dielectric layer 320 is an insulating material, of which the material includes one or more of silicon oxide, silicon nitride, silicon oxynitride, silicon oxycarbide, silicon carbo-nitride and silicon carbo-oxynitride. In this implementation, the material of the interlayer dielectric layer 320 is silicon oxide.

In this implementation, the step of forming the interlayer dielectric layer 320 includes: forming a dielectric material layer (not shown in the figure) on the base 100, and covering the sidewall and the top of the poly gate layer 200; and performing a planarization treatment on the dielectric material layer, and reserving the remaining dielectric material layer located on the base 100 on the side of the poly gate layer 200 to serve as the interlayer dielectric layer 320.

In this implementation, in the process of performing a planarization treatment on the dielectric material layer, since the line width dimension, the top surface area and the spacing from an adjacent top gate layer 220 of the top gate layer 220 are relatively small, it is beneficial to alleviate the problem of top surface dishing of the poly gate layer 200 of the first region 100M. Furthermore, the polish block layer 240 and the side wall 280 are further formed on the sidewall of the groove 230, and the polish block layer 240 and the side wall 280 can also play a role of blocking polish for the planarization treatment, thereby improving the effect of alleviating the problem of top surface dishing of the poly gate layer 200 of the first region 100M.

In this implementation, the dielectric material layer is formed using a deposition process. The deposition process includes a chemical vapor deposition process. In this implementation, the planarization treatment process includes a chemical-mechanical planarization (CMP) process.

In this implementation, in the process of forming the interlayer dielectric layer 320, the gate mask layer 175, the side wall 280 and the polish block layer 240 are also planarized. Therefore, in the process of forming the interlayer dielectric layer 320, the gate mask layer 175 located on the top of the poly gate layer 200, and the side wall 280 and the polish block layer 240 higher than the top of the poly gate layer 200 are also removed.

In this implementation, the thickness of the gate dielectric layer 260 of the first region 100M is greater than the thickness of the gate dielectric layer 260 of the second region 100L. Therefore, the top surface of the poly gate layer 200 of the first region 100M is higher than the top surface of the poly gate layer 200 of the second region 100L, and accordingly, in order to expose the top surface of the poly gate layer 200 of the second region 100L, the top surface of the poly gate layer 200 of the first region 100M is usually exposed after the forming the interlayer dielectric layer 320.

In an example, the interlayer dielectric layer 320 fills the groove 230.

Figure 16:
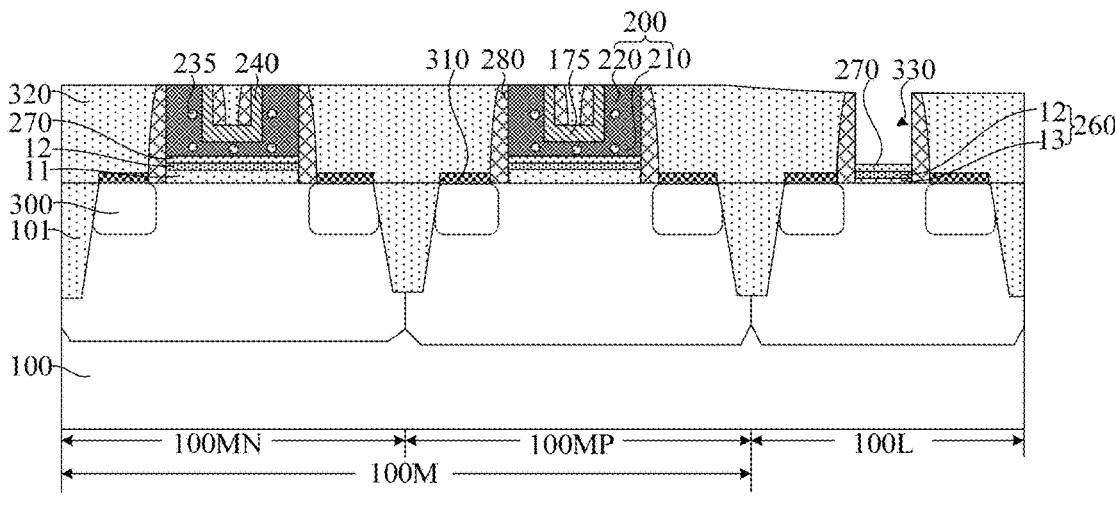

With reference to FIG. 16, the poly gate layer 200 of the second region 100L is removed to form a gate opening 330 in the interlayer dielectric layer 320. The gate opening 330 exposes the metal block layer 270.

The gate opening 330 is configured to provide a spatial location for forming the metal gate layer.

In this implementation, the poly gate layer 200 of the second region 100L is removed using the metal block layer 270 of the second region 100L as an etch stop layer. In this implementation, the poly gate layer 200 of the second region 100L is removed using one or both of a dry etching process and a wet etching process.

Figure 17:
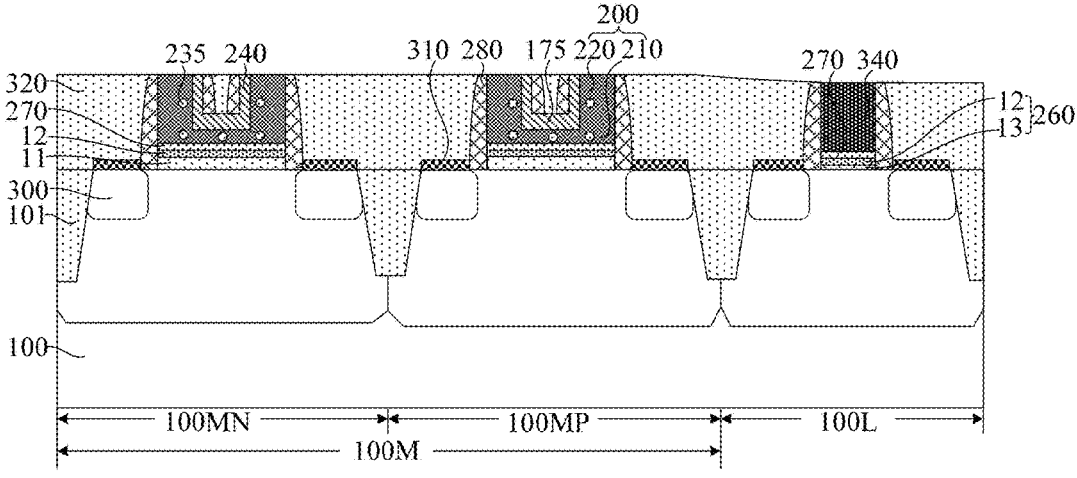

With reference to FIG. 17, a metal gate layer 340 is formed in the gate opening 330.

The high-k gate dielectric layer 12, the metal block layer 270, and the metal gate layer 340 in the second region 100L are configured to form a metal gate structure. Since the channel length of the second device is smaller, the operating voltage of the second device is smaller, and as the critical dimensions of the device continue to shrink, it is advantageous to improve the short channel effect by using the metal gate structure.

The metal gate layer 340 is configured to control a conducting channel of the second device to be opened or closed during device operation, and the high-k dielectric layer 12 is configured to isolate the metal gate layer 340 from the conducting channel.

The material of the metal gate layer 340 is Al, Cu, Ag, Au, Pt, Ni, Ti or W. In this implementation, the material of the metal gate layer 340 is Al.

In this implementation, the step of forming the metal gate layer 340 includes: filling a metal gate material layer (not shown in the figure) in the gate opening 330, the metal gate material layer also being formed on the top of the interlayer dielectric layer 320; and performing a planarization treatment on the metal gate material layer, and reserving the remaining metal gate material layer located in the gate opening 330 to serve as the metal gate layer 340.

In this implementation, the process of forming the metal gate material layer includes one or more of an atomic layer deposition process, a physical vapor deposition process, and an electrochemical plating process. In this implementation, the planarization treatment process includes a CMP process.

In the process of performing a planarization treatment on the metal gate material layer, since the line width dimension, the top surface area, and the spacing from an adjacent top gate layer 220 of the top gate layer 220 are relatively small, and the polish block layer 240 located on the sidewall of the groove 230 can play a role of blocking polish, the probability of the problem of dishing occurring on the top surface of the poly gate layer 200 of the first region 100M is low.

Figure 18:
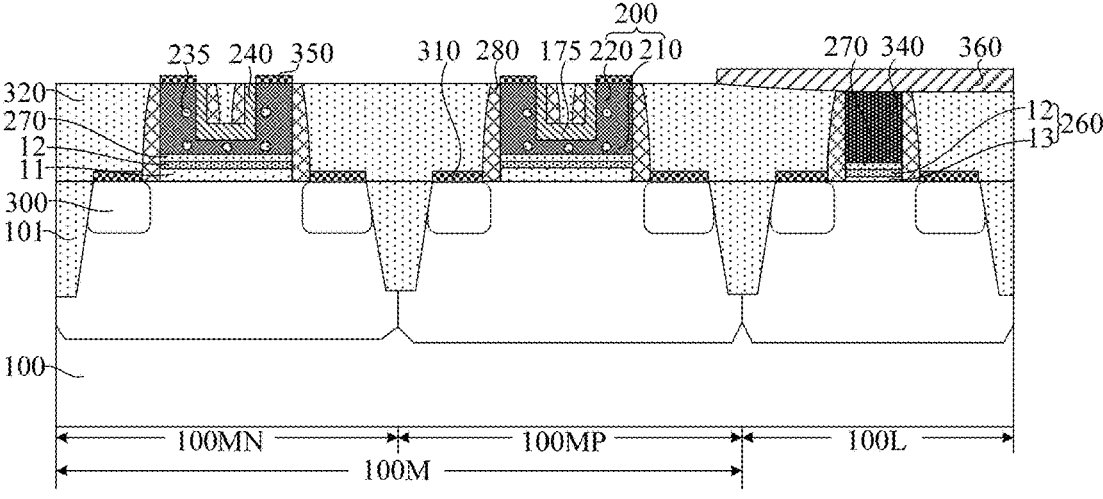

With reference to FIG. 18, in this implementation, the forming method further includes: after forming the metal gate layer 340, forming the gate salicide layer 350 on the top surface of the top gate layer 220.

The subsequent steps further include: forming a gate contact plug on the top surface of the top gate layer 220, the gate salicide layer 350 being configured to reduce the contact resistance between the gate contact plug and the poly gate layer 200.

In this implementation, the material of the gate salicide layer 350 may be a nickel-silicon compound, a cobalt-silicon compound, or a titanium-silicon compound.

In this implementation, the step of forming the gate salicide layer 350 includes: forming a protective layer 360 covering the metal gate layer 200, the protective layer 360 exposing the first region 100M; and forming the gate salicide layer 350 on the poly gate layer 200 exposed by the protective layer 360.

The protective layer 360 is configured to protect the metal gate layer 340. The protective layer 360 is a dielectric material, such as silica.

Figure 19:
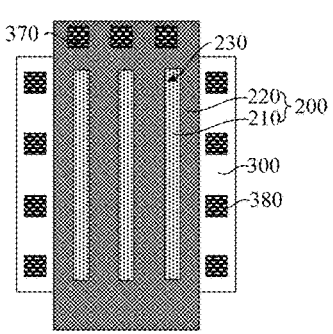

With reference to FIG. 19, a top view of the first region 100M is shown, and the subsequent steps further include: forming a first gate contact plug 370 in contact with the top gate layer 220, a second gate contact plug in contact with the metal gate layer 340, and a source/drain contact plug 380 in contact with the source/drain doped region 300.

For ease of illustration and explanation, only the poly gate layer 200, the groove 230, the first gate contact plug 370, the source/drain doped region 300, and the source/drain contact plug 380 are illustrated in FIG. 19, and other related structures are not illustrated.

FIG. 20 to FIG. 25 are schematic structural diagrams of a method for forming a semiconductor structure in another implementation of the present disclosure. The similarities between this implementation of the present disclosure and the foregoing implementation are not repeated here, but the differences between this implementation of the present disclosure and the foregoing implementation are that a gate salicide layer is formed on the top surface of the bottom gate layer at the bottom of the groove after the poly gate layer is formed and before an interlayer dielectric layer is formed.

Steps of the method for forming the semiconductor structure of this implementation will be described in detail below with reference to the accompanying drawings.

Figure 20:
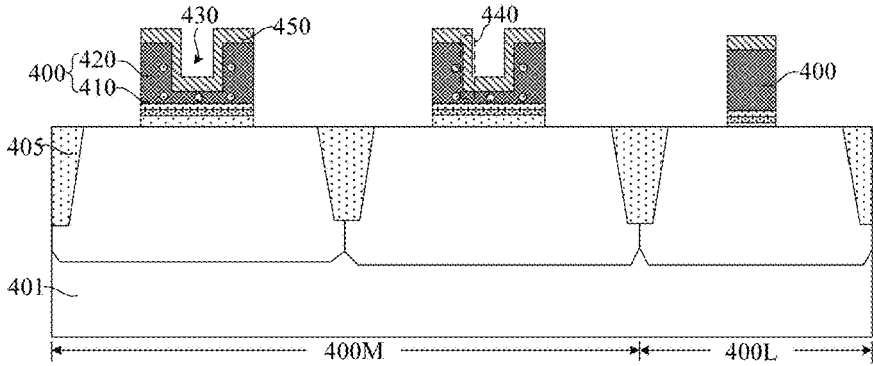
FIG. 20 to FIG. 25 are schematic structural diagrams corresponding to various steps of a method for forming a semiconductor structure according another implementation of the present disclosure.
Figure 21:
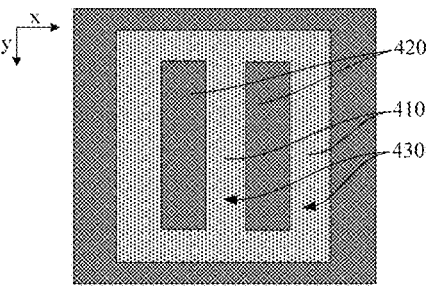

With reference to FIG. 20 and FIG. 21, discrete poly gate layers 400 are formed on a base 401 of a first region 400M and a second region 400L, the poly gate layer 400 of the first region 400M includes a bottom gate layer 410 and a top gate layer 420 protruding out of the bottom gate layer 410, the top gate layer 420 and the bottom gate layer 410 define a groove 430, and a polish block layer 440 is formed on the sidewall of the groove 430.

FIG. 21 is a top view of the poly gate layer 400 of the first region 400M.

With the channel direction of the device being a first direction (for example, the x-direction in FIG. 21) and the direction perpendicular to the first direction being a second direction (for example, the y-direction in FIG. 21), the poly gate layer 400 extends in the second direction.

In an example, the number of the grooves 430 in each of the poly gate layers 400 is plural, and the plurality of grooves 430 extend in the second direction and are arranged in parallel at intervals in the first direction.

In this implementation, the groove 430 also extends in the first direction at the end of the poly gate layer 400, and a gate salicide layer will subsequently be formed on the top surface of the bottom gate layer 410 at the bottom of the groove 430, and is connected with a first gate contact plug in contact with the bottom gate layer 410 through the gate salicide layer at the bottom of the groove 430. Specifically, the groove 430 located at the end of the poly gate layer 400 and extending in the first direction is located above an isolation structure 405 so that the first gate contact plug subsequently can be in contact with the gate salicide layer located above the isolation structure 405.

In this implementation, a gate mask layer 450 is further formed at the bottom of the groove 430 and the top of the top gate layer 420 in the step of forming the poly gate layer 400 and the polish block layer 440. The gate mask layer 450 serves as an etch mask for patterning a poly gate material layer to form the poly gate layer 400.

Figure 22:
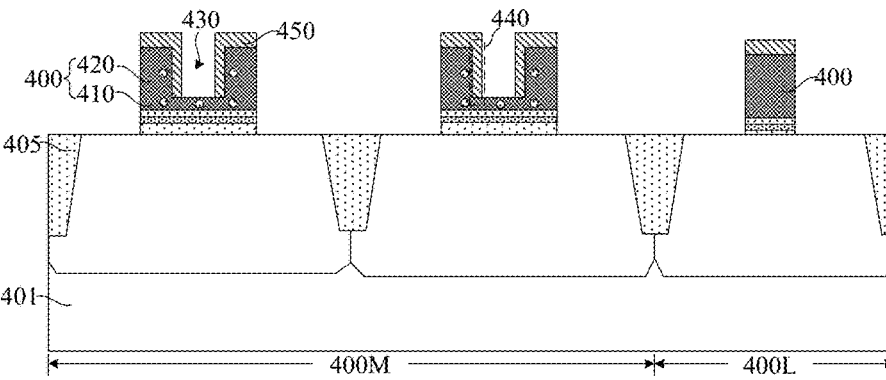

With reference to FIG. 22, the method for forming the semiconductor structure further includes: after forming the poly gate layer 400 and the polish block layer 440 and before forming a source/drain doped region, removing the gate mask layer 450 located at the bottom of the groove 430 to expose the bottom gate layer 410 at the bottom of the groove 430.

The bottom gate layer 410 at the bottom of the groove 430 is exposed so that the gate salicide layer can subsequently be formed on the top surface of the bottom gate layer 410 at the bottom of the groove 430.

Specifically, in this implementation, a masking layer (not shown in the figure) may be formed on the base 401 and the poly gate layer 400 using a mask during forming the groove 430, a masking opening (not shown in the figure) is formed in the masking layer above the groove 430, and then the gate mask layer 450 at the bottom of the groove 430 is etched along the masking opening by using the masking layer as a mask.

Therefore, in this implementation, the step of removing the gate mask layer 450 located at the bottom of the groove 430 can share a mask with the step of forming the groove 430, which is beneficial for saving one mask and reducing the costs.

In this implementation, an anisotropic dry etching process is used to remove the gate mask layer 450 located at the bottom of the groove 430. The longitudinal etching rate of the anisotropic dry etching process is much greater than the lateral etching rate, thereby facilitating reducing the probability of damage to the polish block layer 440 located on the sidewall of the groove 430 while the gate mask layer 450 located at the bottom of the groove 430 is etched, and then ensuring the polish block effect of the polish block layer 440 in the subsequent planarization treatment process.

Figure 23:
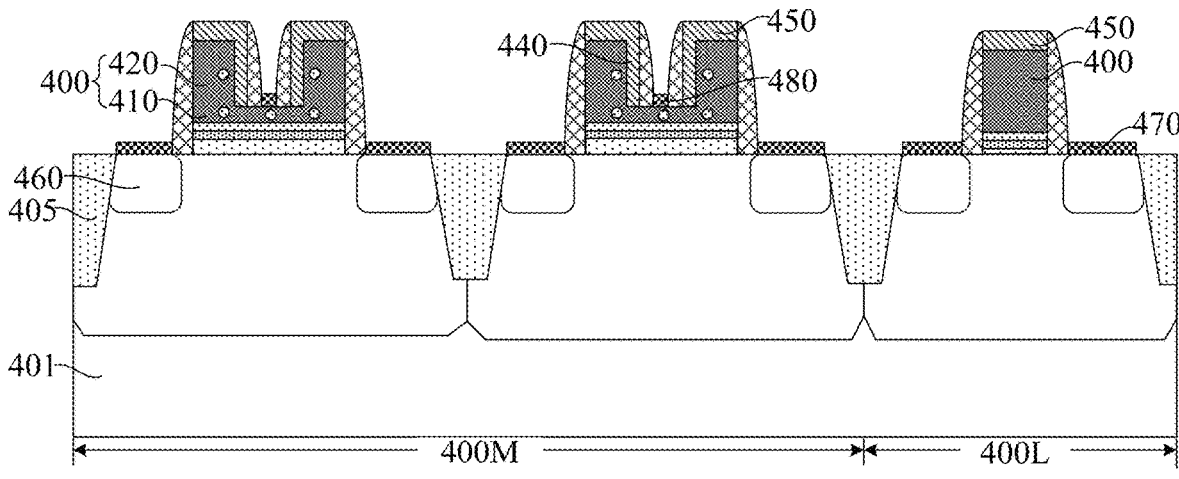

With reference to FIG. 23, after forming the poly gate layer 400 and the polish block layer 440, a gate salicide layer 480 is formed on the top surface of the bottom gate layer 410 at the bottom of the groove 430.

By forming the gate salicide layer 480 on the bottom surface of the groove 430, a current is allowed to flow through the gate salicide layer 480 when a first device is in operation, thereby serving to reduce the gate resistance.

A first gate contact plug in contact with the poly gate layer 400 is subsequently formed, and the gate salicide layer 480 may reduce the contact resistance between the first gate contact plug and the poly gate layer 400.

In this implementation, after forming the poly gate layer 400 and the polish block layer 440, the forming method further includes: forming a source/drain doped region 460 in the base 401 on both sides of the poly gate layer 400; and forming a source and drain salicide layer 470 on the top surface of the source/drain doped region 460 (as shown in FIG. 23).

In this implementation, in the step of forming the source and drain salicide layer 470, the gate salicide layer 480 is formed on the top surface of the bottom gate layer 410 at the bottom of the groove 430.

In addition, a source/drain contact plug is formed on the top of the source/drain doped region 460, thereby reducing the contact resistance between the source/drain doped region 460 and the source/drain contact plug by forming the source and drain salicide layer 470.

It would be appreciated that the gate mask layer 450 is formed on the top of the top gate layer 420. The gate mask layer 450 serves as a protective layer in the process of forming the gate salicide layer 480, thereby avoiding the formation of the gate salicide layer 480 on the top surface of the poly gate layer 400. The gate salicide layer 480 is not polished in the planarization treatment process of subsequently forming the metal gate layer, thereby avoiding metal contamination to a polishing machine table. Furthermore, this implementation forms the source and drain salicide layer 470 and the gate salicide layer 480 in the same step, thereby simplifying the process steps and improving the process compatibility.

Specifically, a metal layer is formed on the surface of the source/drain doped region 460 and the bottom surface of the groove 430, and an annealing treatment is performed so that the metal layer reacts with the material of the source/drain doped region 460 and the bottom gate layer 410, thereby converting the metal layer located on the surface of the source/drain doped region 460 into the source and drain salicide layer 470, converting the metal layer located on the bottom surface of the groove 430 into the gate salicide layer 480, and after forming the source and drain salicide layer 470 and the gate salicide layer 480, removing the unreacted remaining metal layer.

Figure 24:
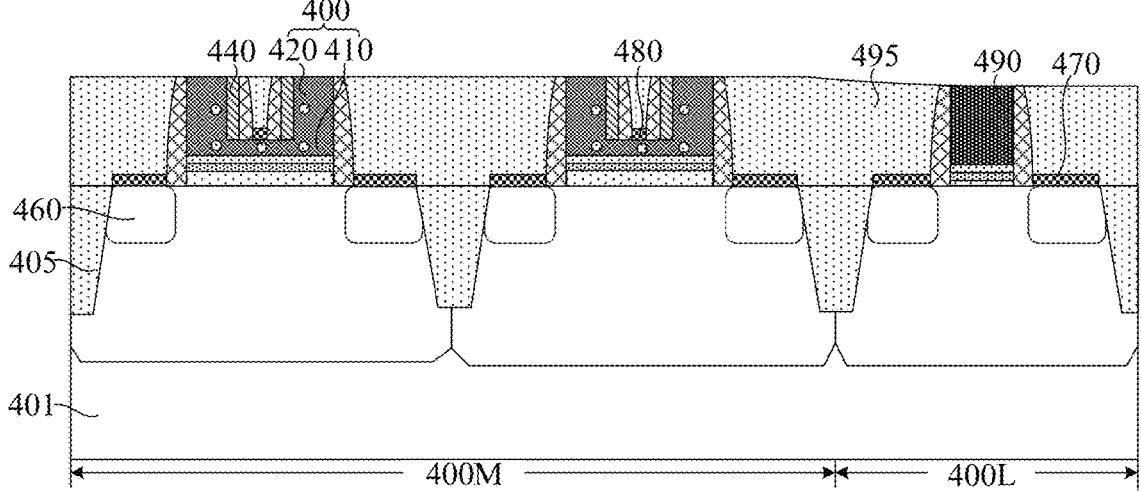

With reference to FIG. 24, an interlayer dielectric layer 495 is formed on the base 401 on the side of the poly gate layer 400, and the interlayer dielectric layer 495 exposes the top surface of the poly gate layer 400 of the second region 400L; the poly gate layer 400 of the second region 400L is removed, and a gate opening (not shown in the figure) is formed in the interlayer dielectric layer 495; and a metal gate layer 490 is formed in the gate opening.

Figure 25:
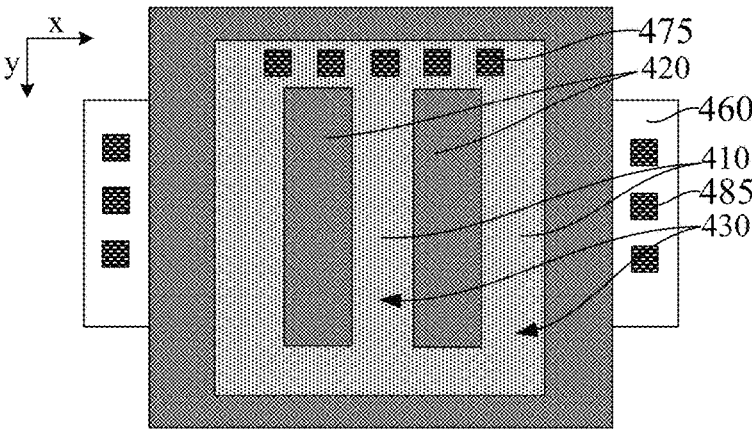

With reference to FIG. 25, a top view of the first region 400M is shown, after forming the interlayer dielectric layer 495 and the metal gate layer 490, subsequent steps further include: forming a first gate contact plug 475 in contact with the bottom gate layer 410, a second gate contact plug (not shown in the figure) in contact with the metal gate layer 490, and a source/drain contact plug 485 in contact with the source/drain doped region 460.

For ease of illustration and explanation, only the poly gate layer 400, the first gate contact plug 475, the source/drain doped region 460, and the source/drain contact plug 485 are illustrated in FIG. 25, and other related structures are not illustrated.

The detailed description of the method for forming the semiconductor structure in this implementation may refer to the corresponding description of the foregoing implementation, and will not be repeated herein.

Accordingly, the present disclosure further provides a semiconductor structure. With reference to FIG. 18 and FIG. 19, a schematic structural diagram of a semiconductor structure in one implementation of the present disclosure is shown.

The semiconductor structure includes: a base 100 including a first region 100M for forming a first device and a second region 100L for forming a second device, the channel length of the first device being greater than the channel length of the second device; a poly gate layer 200 located on the base 100 of the first region 100M, the poly gate layer 200 including a bottom gate layer 210 and a top gate layer 220 protruding out of the bottom gate layer 210, the top gate layer 220 and the bottom gate layer 210 defining a groove 230; a metal gate layer 340 located on the base 100 of the second region 100L; a polish block layer 240 located on the sidewall of the groove 230; and an interlayer dielectric layer 320 located on the base 100 on the side of the metal gate layer 340 and the poly gate layer 200.

In the semiconductor structure, the poly gate layer 200 is located on the base 100 of the first region 100M, the poly gate layer 200 includes the bottom gate layer 210 and the top gate layer 220 protruding out of the bottom gate layer 210, and the top gate layer 220 and the bottom gate layer 210 define the groove 230, where the line width dimension, the top surface area and the spacing from an adjacent top gate layer 220 of the top gate layer 220 of the first region 100M are relatively small by the top gate layer 220, which is beneficial to alleviate the problem of top surface dishing generated on the poly gate layer 200 when forming the interlayer dielectric layer 320 or the metal gate layer 340. In addition, the semiconductor structure further includes a polish block layer 240, which is located on the sidewall of the groove 230, and in the planarization process of forming the interlayer dielectric layer 320 or the metal gate layer 340, the polish block layer 240 can play a role of blocking polish, thereby improving the effect of alleviating the problem of top surface dishing of the poly gate layer 200 of the first region 100M. In summary, this implementation is advantageous to improve the performance of the poly gate layer 200 of the first region 100M, thereby improving the performance of the semiconductor structure.

In this implementation, the base 100 is, for example, a planar substrate in which the base 100 is configured to form a planar field effect transistor. In other implementations, the base is configured to form a fin field effect transistor (FinFET). Accordingly, the base includes a substrate and a fin protruding out of the substrate.

In this implementation, the base 100 is a silicon substrate. In some other implementations, the base may alternatively be a substrate of other material types.

The channel length of the first device is greater than the channel length of the second device such that the operating voltage of the first device is higher than the operating voltage of the second device.

In this implementation, the first device includes one or both of a medium voltage device and a high voltage device, and the second device is a low voltage device. The operating voltages of the low voltage device, the medium voltage device and the high voltage device successively increase. In an example, the operating voltage of the low voltage device is less than 1.5 V, the operating voltage of the medium voltage device is between 1 V and 10 V, and the operating voltage of the high voltage device is greater than 10 V.

The first device may be an NMOS device or a PMOS device. Similarly, the second device may alternatively be an NMOS device or a PMOS device. In an example, the first region 100M includes a first sub-region 100MN and a second sub-region 100MP, and the first sub-region 100MN and the second sub-region 100MP are configured to form first devices of different channel conductivity types. For example, the first device located in the first sub-region 100MN is an NMOS device and the first device located in the second sub-region 100MP is a PMOS device.

In this implementation, an isolation structure 101 is further formed in the base 100. Specifically, the isolation structure 101 is located in the base 100 at the junction of the first region 100M and the second region 100L. In the first region 100M, the isolation structure 101 is also located in the base 100 at the junction of the first sub-region 100MN and the second sub-region 100MP.

The isolation structure 101 is configured to isolate between adjacent devices. In this implementation, the material of the isolation structure 101 is an insulating material, and the insulating material includes silicon oxide.

The poly gate layer 200 serves as a device gate structure for the first device, thereby controlling the channel of the first device to be opened or closed.

The step of forming the metal gate layer 340 includes the process of performing a planarization treatment on a metal gate material layer, and the larger the size of the metal gate layer 340, the higher the probability of the problem of dishing occurring on the top surface of the metal gate layer 340 in the planarization process of the metal gate material. Since the first region 100M is configured to form the first device, the operating voltage of the first device is relatively high, and the gate size of the first device is correspondingly relatively large. By making the first device use the poly gate layer 200, the use of the metal gate layer in the first device is avoided, thereby avoiding the problem of top surface dishing of the metal gate layer caused by the relatively large gate size in the first region 100M.

By forming a groove 230 in the poly gate layer 200 of the first region 100M, the line width dimension, the top surface area and the spacing from an adjacent top gate layer 220 of the top gate layer 220 are relatively small. Therefore, in the planarization treatment process of forming the metal gate layer 340, the probability of over polish caused in the poly gate layer 200 of the first region 100M is relatively low, which is beneficial to alleviate the problem of top surface dishing of the poly gate layer 200 of the first region 100M. The flatness of the top surface of the poly gate layer 200 of the first region 100M is relatively high, and the structural integrity of the poly gate layer 200 of the first region 100M is correspondingly improved.

In this implementation, the first region 100M includes a first sub-region 100MN and a second sub-region 100MP, and the poly gate layer 200 is discrete from the first sub-region 100MN and the second sub-region 100MP.

In this implementation, the material of the poly gate layer 200 is polysilicon.

It would be appreciated that, the ratio of the thickness of the bottom gate layer 210 to the total thickness of the poly gate layer 200 is preferably neither too small nor too large. If the ratio is too small, it is easy to cause the thickness of the bottom gate layer 210 to be too small. In consideration of the effects of etch uniformity and a load effect, in the process of forming the groove 230, the probability that the bottom gate layer 210 exposed by the top gate layer 220 is etched through is relatively high, namely, it is easy for the groove 230 to penetrate the whole poly gate layer 200, thereby affecting the performance of the poly gate layer 200 of the first region 100M. When conductive ions are implanted in the bottom and sidewall of the groove 230, the conductive ions may be implanted to a film layer structure below the bottom gate layer 210 (for example, a gate oxide layer) by passing through the bottom gate layer 210, thereby leading to device failure. If the ratio is too large, accordingly, the thickness of the top gate layer 220 is too small, in the planarization treatment process of forming the metal gate layer 340, it is easy to cause the top gate layer 220 to be completely removed, thereby easily causing over polish of the bottom gate layer 210, and then easily reducing the improvement effect on the problem of top surface dishing of the poly gate layer 200 of the first region 100M. To this end, in this implementation, the bottom gate layer 210 has a thickness of ⅕ to ⅓ of the total thickness of the poly gate layer 200.

It would be appreciated that the line width of the top gate layer 220 and the line width of the groove 230 are preferably neither too small nor too large. If the line width of the top gate layer 220 and the line width of the groove 230 are too small, it is easy to increase the process difficulty of using a photolithography process when forming the groove 230, and the spacing from the adjacent top gate layers 220 is too small, namely, the line width of the groove 230 is correspondingly too small, easily having an adverse effect on the filling effect of the interlayer dielectric layer 320 in the groove 230. If the line width of the groove 230 is too large, the risk of the problem of top surface dishing occurring on the interlayer dielectric layer 320 located in the groove 230 is easily increased in the planarization treatment process of forming the metal gate layer 340, and if the line width of the top gate layer 220 is too large, the probability of the problem of top surface dishing occurring on the top gate layer 220 is relatively high when the metal gate layer 340 is formed. To this end, in this implementation, the line width of the top gate layer 220 is 0.15 micron to 2 microns.

Similarly, the groove 230 has an opening line width of 0.15 micron to 2 microns.

It would be appreciated that, as shown in FIG. 18, the number of the groove 230 in the poly gate layer 200 of the first region 100M is one. However, the number of the grooves 230 in the poly gate layer 200 of the first region 100M is not limited to one, but may be other numbers. For example, with reference to FIG. 19, a top view of the poly gate layer 200 of the first region 100M is illustrated. When the size of the first device is large, the number of grooves 230 in the poly gate layer 200 of the first region 100M may alternatively be plural, and the plurality of grooves 230 may be arranged in parallel at intervals.

The polish block layer 240 can play a role of blocking polish in the planarization treatment process of forming the interlayer dielectric layer 320 and forming the metal gate layer 340, thereby improving the effect of alleviating the problem of top surface dishing of the poly gate layer 200 of the first region 100M.

To this end, the material of the polish block layer 240 is selected to have a relatively high hardness and density to ensure that the polish block layer 240 acts as a polish block layer in the planarization treatment process. Specifically, the material of the polish block layer 240 is selected according to the requirement that the density and hardness of the material of the polish block layer 240 is greater than the hardness and density of the material of the poly gate layer 200, the interlayer dielectric layer 320 and the metal gate layer 340. Meanwhile, a material having high process compatibility is selected for the polish block layer 240 in view of process compatibility, thereby reducing the process risk and cost.

In this implementation, the material of the polish block layer 240 includes silicon nitride or silicon oxynitride. In an example, the material of the polish block layer 240 is silicon nitride.

In this implementation, the semiconductor structure further includes: a gate mask layer 175 located at the bottom of the groove 230, the gate mask layer 175 and the polish block layer 240 being of an integrated structure.

The gate mask layer 175 serves as a mask for patterning a poly gate material layer to form the poly gate layer 200.

The gate mask layer 175 and the polish block layer 240 are of an integrated structure, because in the step of forming the gate mask layer 175, the gate mask layer 175 located on the sidewall of the groove 230 serves as the polish block layer 240, thereby integrating the process of forming the gate mask layer 175, the process of forming the poly gate layer 200 and the process of forming the polish block layer 240, which is beneficial to improving the process integration degree and the process compatibility.

Thus, the material of the gate mask layer 175 is the same as the material of the polish block layer 240.

In this implementation, the poly gate layer 200 at the sidewall and bottom of the groove 230 is doped with conductive ions 235. The conductive ions 235 are configured to reduce the resistance of the poly gate layer 200 of the first region 100M, thereby reducing the gate resistance of the first device.

In this implementation, the conductive ions 235 include B ions, Ga ions, In ions, P ions, As ions, or Sb ions.

In this implementation, the semiconductor structure further includes: a laminated structure 250 located between the poly gate layer 200 and the base 100 of the first region 100M and between the metal gate layer 340 and the base 100 of the second region 100L, where the laminated structure 250 includes a gate dielectric layer 260 and a metal block layer 270 located on the gate dielectric layer 260; and the thickness of the gate dielectric layer 260 of the first region 100M is greater than the thickness of the gate dielectric layer 260 of the second region 100L.

The gate dielectric layer 260 of the first region 100M is configured to electrically isolate the poly gate layer 200 from the channel of the first device. The gate dielectric layer 260 of the second region 100M is configured to electrically isolate the metal gate layer 340 from the channel of the second device.

The thickness of the gate dielectric layer 260 of the first region 100M is greater than the thickness of the gate dielectric layer 260 of the second region 100L, thereby enabling the first device to withstand a greater operating voltage.

In this implementation, the gate dielectric layer 260 of the first region 100M includes a gate oxide layer 11 and a high-k gate dielectric layer 12 located on the gate oxide layer 11, and the gate dielectric layer 260 of the second region 100L includes an interfacial buffer layer 13 and a high-k gate dielectric layer 12 located on the interfacial buffer layer 13, so that the thickness of the gate dielectric layer 260 of the first region 100M is greater because the gate oxide layer 11 is thicker than the interfacial buffer layer 13.

The interfacial buffer layer 13 is configured to improve the electron mobility, and improve the interfacial stability and device reliability. In this implementation, the material of the gate oxide layer 11 and the interfacial buffer layer 13 is silicon oxide.

In this implementation, the material of the high-k gate dielectric layer 12 is a high-k dielectric material. Specifically, the material of the high-k gate dielectric layer 12 may be selected from HfO2, ZrO2, HfSiO, HfSiON, HfTaO, HfTiO, HfZrO, Al2O3, or the like. In an example, the material of the high-k gate dielectric layer 12 is HfO2.

The metal block layer 270 is configured to isolate the gate dielectric layer 260 from the poly gate layer 200, and isolate the gate dielectric layer 260 from the metal gate layer 340 so as to protect the gate dielectric layer 260, and the metal block layer 270 is also configured to block diffusion of readily diffusible ions in the metal gate layer 340 (for example: aluminum ions) into the gate dielectric layer 260. Specifically, the metal block layer 270 is configured to protect the high-k gate dielectric layer 12, reduce the probability of damage to the high-k gate dielectric layer 12, and prevent diffusion of readily diffusible ions in the metal gate layer 340 into the high-k gate dielectric layer 12. The metal block layer 270 also has a certain effect on the gate work function of the second device.

The material of the metal block layer 270 includes one or both of TiN and TiSiN doped with silicon. In this implementation, the material of the metal block layer 270 is titanium nitride.

In the actual technological process, the thickness of the metal block layer 270 is rationally set so as to ensure that the metal block layer 270 can act as an etch stop layer in the subsequent etching process for removing the poly gate layer 200 of the second region 100L, and in addition, the metal block layer 270 has a better blocking effect on the readily diffusible ions in the metal gate layer.

The high-k gate dielectric layer 12, the metal block layer 270, and the metal gate layer 340 in the second region 100L are configured to form a metal gate structure. Since the channel length of the second device is smaller, the operating voltage of the second device is smaller, and as the critical dimensions of the device continue to shrink, it is advantageous to improve the short channel effect by using the metal gate structure.

The metal gate structure is configured to control a conducting channel of the second device to be opened or closed during device operation.

The metal gate layer 340 is configured to extract the electrical property of the metal gate structure. The material of the metal gate layer 340 is Al, Cu, Ag, Au, Pt, Ni, Ti or W. In this implementation, the material of the metal gate layer 340 is Al.

In this implementation, the semiconductor structure further includes: a side wall 280 located on the sidewall of the poly gate layer 200 and the metal gate layer 340 and on the sidewall of the groove 230.

The side wall 280 is configured to protect the sidewall of the poly gate layer 200 and the metal gate layer 340 and also configured to define the location of a source/drain doped region 300. Furthermore, the side wall 280 is further formed on the sidewall of the groove 230 to be beneficial to further reduce the probability of over polish of the top surface of the poly gate layer 200 in the first region 100M in the planarization treatment process of forming the interlayer dielectric layer 320 and the metal gate layer 340, thereby further alleviating the problem of top surface dishing of the poly gate layer 200.

In this implementation, the material of the side wall 280 includes silicon nitride. The silicon nitride has a relatively high hardness and density, and the planarization process has a relatively low polishing rate on the side wall 280, thereby further alleviating the problem of top surface dishing of the poly gate layer 200 of the first region 100M.

The side wall 280 may be of a laminated structure or a single layer structure. In an example, the side wall 280 is of a laminated structure, and the side wall 280 includes a first silicon oxide layer covering the sidewalls of the poly gate layer 200 and the groove 230, a silicon nitride layer covering the sidewall of the first silicon oxide layer, and a second silicon dioxide layer located on the silicon nitride layer.

The semiconductor structure further includes: the source/drain doped region 300 located in the base 100 of the first region 100M on both sides of the poly gate layer 200 and in the base 100 of the second region 100L on both sides of the metal gate layer 340; and a source and drain salicide layer 310 located between the top surface of the source/drain doped region 300 and the interlayer dielectric layer 320.

The source/drain doped region 300 serves as a source region or drain region of the formed device.

When the device is an NMOS device, doped ions in the source/drain doped region 300 are N-type ions, where the N-type ions include P ions, As ions or Sb ions. When the device is a PMOS device, doped ions in the source/drain doped region 300 are P-type ions, where the P-type ions include B ions, Ga ions or In ions.

The semiconductor structure generally further includes a source/drain contact plug located on the top of the source/drain doped region 300 and being in contact with the source/drain doped region 300, and the source and drain salicide layer 310 is configured to reduce the contact resistance between the source/drain doped region 300 and the source/drain contact plug. In this implementation, the material of the source and drain salicide layer 310 may be a nickel-silicon compound, a cobalt-silicon compound, or a titanium-silicon compound.

The interlayer dielectric layer 320 is configured to isolate adjacent devices. The material of the interlayer dielectric layer 320 is an insulating material, of which the material includes one or more of silicon oxide, silicon nitride, silicon oxynitride, silicon oxycarbide, silicon carbo-nitride and silicon carbo-oxynitride. In this implementation, the material of the interlayer dielectric layer 320 is silicon oxide.

In this implementation, the top surface of the poly gate layer 200 of the first region 100M is higher than the top surface of the poly gate layer 200 of the second region 100L, and accordingly, the top surface of the interlayer dielectric layer 320 of the second region 100L is lower than the top surface of the interlayer dielectric layer 320 of the first region 100M, and the interlayer dielectric layer 320 also exposes the top surface of the poly gate layer 200 of the first region 100M. In an example, the interlayer dielectric layer 320 fills the groove 230.

In this implementation, the semiconductor structure further includes a gate salicide layer 350 located on the top surface of the top gate layer 220. The semiconductor structure generally further includes a gate contact plug located on the top surface of the top gate layer 220 and being in contact with the top gate layer 220, the gate salicide layer 350 serving to reduce the contact resistance between the first gate contact plug and the poly gate layer 200.

In this implementation, the material of the gate salicide layer 350 may be a nickel-silicon compound, a cobalt-silicon compound, or a titanium-silicon compound.

With reference to FIG. 19, a top view of the first region 100M is shown, the semiconductor structure further includes a first gate contact plug 370 in contact with the top gate layer 220, a second gate contact plug (not shown in the figure) in contact with the metal gate layer 340, and a source/drain contact plug 380 in contact with the source/drain doped region 300.

For ease of illustration and explanation, only the poly gate layer 200, the first gate contact plug 370, the source/drain doped region 300, and the source/drain contact plug 380 are illustrated in FIG. 19, and other related structures are not illustrated.

The semiconductor structure may be formed using the forming method described in the foregoing implementation, or may be formed using other forming methods. The detailed description of the semiconductor structure in this implementation may refer to the corresponding description of the foregoing implementation, and will not be repeated herein.

FIG. 24 and FIG. 25 are schematic structural diagrams of a semiconductor structure in another implementation of the present disclosure. The similarities between this implementation of the present disclosure and the foregoing implementation are not repeated here, but the differences between this implementation of the present disclosure and the foregoing implementation are that a gate salicide layer 480 is located on the top surface of the bottom gate layer 410 at the bottom of the groove (not marked).

By arranging the gate salicide layer 480 on the bottom surface of the groove 430, a current is allowed to flow through the gate salicide layer 480 when a first device is in operation, thereby serving to reduce the gate resistance. The gate salicide layer 480 serves to reduce the contact resistance between the first gate contact plug and the poly gate layer 400.

With the channel direction of the device being a first direction (for example, the x-direction in FIG. 25) and the direction perpendicular to the first direction being a second direction (for example, the y-direction in FIG. 25), the poly gate layer 400 extends in the second direction.

As shown in FIG. 25, in an example, the number of the grooves 430 in each of the poly gate layers 400 is plural, and the plurality of grooves 430 extend in the second direction and are arranged in parallel at intervals in the first direction.

In this implementation, the groove 430 also extends in the first direction at the end of the poly gate layer 400, so that the groove 430 is communicated, and is connected with the gate salicide layer 480 located at the bottom of the groove 430.

The semiconductor structure further includes: the source/drain doped region 460 located in the base 401 of the first region 400M on both sides of the poly gate layer 200 and in the base 401 of the second region 400L on both sides of the metal gate layer 490; and a source and drain salicide layer 470 located between the top surface of the source/drain doped region 460 and the interlayer dielectric layer 495, the materials of the source and drain salicide layer 470 and the gate salicide layer 480 being the same.

The source and drain salicide layer 470 is configured to reduce the contact resistance between the source/drain doped region 460 and the source/drain contact plug.

The materials of the source and drain salicide layer 470 and the gate salicide layer 480 are the same, because this implementation forms the source and drain salicide layer 470 and the gate salicide layer 480 in the same step, thereby simplifying the process steps and improving the process compatibility.

With reference to FIG. 25, a top view of the first region 400M is shown, the semiconductor structure generally further includes: a first gate contact plug 475 located on the top of the top gate layer 420 and being in contact with the top gate layer 420; a second gate contact plug (not shown in the figure) located on top of the metal gate layer 490 and being in contact with the metal gate layer 490; and a source/drain contact plug 485 located on top of the source/drain doped region 460 and being in contact with the source/drain doped region 460.

For ease of illustration and explanation, only the poly gate layer 400, the first gate contact plug 475, the source/drain doped region 460, and the source/drain contact plug 485 are illustrated in FIG. 25, and other related structures are not illustrated.

The semiconductor structure may be formed using the forming method described in the foregoing implementation, or may be formed using other forming methods. The detailed description of the semiconductor structure in this implementation may refer to the corresponding description of the foregoing implementation, and will not be repeated herein.

Although embodiments and implementations of the present disclosure are described above, the present disclosure is not limited thereto. Various changes and modifications may be made by those skilled in the art without departing from the spirit and scope of the present disclosure, and therefore the protection scope of the present disclosure shall be as defined by the claims.

What is claimed is:

1. A semiconductor structure, comprising:
   a base comprising a first region for forming a first device and a second region for forming a second device, a channel length of the first device being greater than a channel length of the second device;
   a poly gate layer located on the base of the first region, the poly gate layer comprising a bottom gate layer and a top gate layer protruding out of the bottom gate layer, the top gate layer and the bottom gate layer defining a groove;
   a metal gate layer located on the base of the second region;
   a polish block layer located on a sidewall of the groove; and
   an interlayer dielectric layer located on the base on a side of the metal gate layer and the poly gate layer.

2. The semiconductor structure according to claim 1, wherein the poly gate layer at the sidewall and bottom of the groove is doped with conductive ions.

3. The semiconductor structure according to claim 1, wherein material of the polish block layer comprises silicon nitride or silicon oxynitride.

4. The semiconductor structure according to claim 1, wherein the bottom gate layer has a thickness of $\frac{1}{5}$ to $\frac{1}{3}$ of a total thickness of the poly gate layer.

5. The semiconductor structure according to claim 1, further comprising:
   a gate salicide layer located on a top surface of the top gate layer, or on a top surface of the bottom gate layer at the bottom of the groove.

6. The semiconductor structure according to claim 5, wherein the gate salicide layer is located on the top surface of the top gate layer, and the semiconductor structure further comprises:
   a gate mask layer located at the bottom of the groove, the gate mask layer and the polish block layer being of an integrated structure.

7. The semiconductor structure according to claim 5, wherein the gate salicide layer is located on the top surface of the bottom gate layer at the bottom of the groove, and the semiconductor structure further comprises:

a source/drain doped region located in the base of the first region on both sides of the poly gate layer and in the base of the second region on both sides of the metal gate layer; and a source and drain salicide layer located between the top surface of the source/drain doped region and the interlayer dielectric layer, materials of the source and drain salicide layer and the gate salicide layer being the same.

8. The semiconductor structure according to claim 1, further comprising:

side walls located on sidewalls of the poly gate layer and the metal gate layer and on the sidewall of the groove.

9. The semiconductor structure according to claim 1, wherein an opening line width of the groove is 0.15 μm to 2 μm.

10. The semiconductor structure according to claim 1, further comprising:

a laminated structure located between the poly gate layer and the base of the first region and between the metal gate layer and the base of the second region, the laminated structure comprising a gate dielectric layer and a metal block layer located on the gate dielectric layer, a thickness of the gate dielectric layer of the first region being greater than a thickness of the gate dielectric layer of the second region.

11. A method for forming a semiconductor structure, comprising:

providing a base comprising a first region for forming a first device and a second region for forming a second device, a channel length of the first device being greater than a channel length of the second device;

forming discrete poly gate layers on the base of the first region and the second region, the poly gate layer of the first region comprising a bottom gate layer and a top gate layer protruding out of the bottom gate layer, the top gate layer and the bottom gate layer defining a groove, and a polish block layer being formed on the sidewall of the groove;

forming an interlayer dielectric layer on the base on the side of the poly gate layer, the interlayer dielectric layer exposing the top surface of the poly gate layer of the second region;

removing the poly gate layer of the second region, and forming a gate opening in the interlayer dielectric layer; and forming a metal gate layer in the gate opening.

12. The method for forming a semiconductor structure according to claim 11, wherein the step of forming the poly gate layer comprises:

forming a poly gate material layer on the base;

forming the groove in the poly gate material layer of the first region; and patterning the poly gate material layer to form the poly gate layer discrete from the first region and the second region.

13. The method for forming a semiconductor structure according to claim 12, wherein the polish block layer is formed on the sidewall of the groove after forming the groove and before patterning the poly gate material layer.

14. The method for forming a semiconductor structure according to claim 13, wherein the step of forming the polish block layer comprises:

after forming the groove and before patterning the poly gate material layer, forming a gate mask material layer on the poly gate material layer and the bottom and sidewall of the groove, the gate mask material layer located on the sidewall of the groove serving as the polish block layer; and the step of patterning the poly gate material layer comprises:

patterning the gate mask material layer, reserving the gate mask material layer located at the bottom and sidewall of the groove, and extending the gate mask material layer located at the top of the poly gate material layer and located at the top of the poly gate material layer of the second region to serve as a gate mask layer; and with the gate mask layer as a mask, patterning the poly gate material layer to form the poly gate layer.

15. The method for forming a semiconductor structure according to claim 12, further comprising:

doping conductive ions in the poly gate material layer at the bottom and the sidewall of the groove after forming the groove and patterning the poly gate material layer.

16. The method for forming a semiconductor structure according to claim 15, wherein the step of forming the groove comprises:

forming a mask layer on the poly gate material layer, the mask layer having a mask opening located in the first region; and with the mask layer as a mask, etching a partial thickness of the poly gate material layer along the mask opening;

the step of doping the conductive ions in the poly gate material layer at the bottom and the sidewall of the groove comprises:

with the mask layer as a mask, performing ion implantation on the poly gate material layer exposed by the groove, a direction of ion implantation forming an acute angle with the normal of a surface of the base; and the method for forming a semiconductor structure further comprises:

after doping the conductive ions in the poly gate material layer at the bottom and sidewall of the groove, removing the mask layer.

17. The method for forming a semiconductor structure according to claim 16, wherein an implantation energy of ion implantation is 1 KeV to 10 KeV.

18. The method for forming a semiconductor structure according to claim 11, further comprising:

after forming the poly gate layer and the polish block layer and before forming the interlayer dielectric layer, forming side walls on the sidewall of the poly gate layer and the polish block layer on the sidewall of the groove.

19. The method for forming a semiconductor structure according to claim 11, further comprising:

after forming the metal gate layer, forming a gate salicide layer on the top surface of the top gate layer; or after forming the poly gate layer and before forming the interlayer dielectric layer, forming a gate salicide layer on the top surface of the bottom gate layer at the bottom of the groove.

20. The method for forming a semiconductor structure according to claim 19, wherein after forming the metal gate layer, the gate salicide layer is formed on the top surface of the top gate layer;

the step of forming the gate salicide layer comprises:

forming a protective layer covering the metal gate layer, the protective layer exposing the first region; and forming the gate salicide layer on the poly gate layer exposed by the protective layer.

21. The method for forming a semiconductor structure according to claim 19, further comprising:

after forming the poly gate layer and the polish block layer and before forming the interlayer dielectric layer, forming a source/drain doped region in the base on both sides of the poly gate layer;

forming a source and drain salicide layer on the top surface of the source/drain doped region; and in the step of forming the source and drain salicide layer, forming the gate salicide layer on the top surface of the bottom gate layer at the bottom of the groove.

22. The method for forming a semiconductor structure according to claim 21, wherein in the step of forming the poly gate layer and the polish block layer, a gate mask layer is further formed at the bottom of the groove and the top of the top gate layer; and the method for forming a semiconductor structure further comprises:

after forming the poly gate layer and the polish block layer and before forming the source/drain doped region, removing the gate mask layer located at the bottom of the groove to expose the bottom gate layer at the bottom of the groove.

23. The method for forming a semiconductor structure according to claim 21, further comprising:

after forming the source/drain doped region and before forming the source and drain salicide layer, forming a salicide block layer on the top of the top gate layer.

24. The method for forming a semiconductor structure according to claim 21, wherein the step of forming the source/drain doped region comprises:

forming a shield layer on the base, the shield layer covering the poly gate layer of the first region, and forming doping openings in the shield layer on both sides of the poly gate layer;

with the shield layer as a mask, performing ion doping on the base exposed by the doping opening to form the source/drain doped region; and removing the shield layer.

25. The method for forming a semiconductor structure according to claim 11, wherein material of the polish block layer comprises silicon nitride or silicon oxynitride.

26. The method for forming a semiconductor structure according to claim 11, wherein the bottom gate layer has a thickness of $\frac{1}{5}$ to $\frac{1}{3}$ of a total thickness of the poly gate layer.

27. The method for forming a semiconductor structure according to claim 11, wherein an opening line width of the groove is 0.15 µm to 2 µm.

28. The method for forming a semiconductor structure according to claim 11, further comprising:

in the step of forming the poly gate layer, forming a laminated structure located between the poly gate layer and the base, the laminated structure comprising a gate dielectric layer and a metal block layer located on the gate dielectric layer, a thickness of the gate dielectric layer of the first region being greater than a thickness of the gate dielectric layer of the second region.

* * * * *